US009076990B2

(12) United States Patent
Nakamura et al.

(10) Patent No.: US 9,076,990 B2
(45) Date of Patent: Jul. 7, 2015

(54) METHOD OF MANUFACTURING ORGANIC EL DEVICE, ORGANIC EL DEVICE AND ELECTRONIC APPARATUS

(71) Applicant: SEIKO EPSON CORPORATION, Tokyo (JP)

(72) Inventors: Hisatoshi Nakamura, Tatsuno-machi (JP); Shinichi Iwata, Chino (JP); Seiji Atsumi, Chino (JP); Yuki Hanamura, Shiojiri (JP); Suguru Akagawa, Suwa (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 14/044,116

(22) Filed: Oct. 2, 2013

(65) Prior Publication Data
US 2014/0117334 A1 May 1, 2014

(30) Foreign Application Priority Data

Oct. 29, 2012 (JP) ................................. 2012-237563

(51) Int. Cl.
*H01L 51/56* (2006.01)
*H01L 27/32* (2006.01)
(52) U.S. Cl.
CPC ............... *H01L 51/56* (2013.01); *H01L 27/322* (2013.01); *H01L 27/3276* (2013.01)

(58) Field of Classification Search
CPC ............................ H01L 51/56; H01L 27/3276
USPC .................................. 257/40; 438/34, 35, 99
See application file for complete search history.

(56) References Cited

U.S. PATENT DOCUMENTS

| 7,994,504 | B2 * | 8/2011 | Murakami et al. | 257/59 |
| 2005/0285107 | A1 * | 12/2005 | Koo et al. | 257/59 |
| 2008/0090341 | A1 | 4/2008 | Tanaka et al. | 438/158 |
| 2009/0261720 | A1 * | 10/2009 | Shinto | 313/504 |
| 2010/0096988 | A1 * | 4/2010 | Kitabayashi et al. | 315/51 |
| 2011/0037059 | A1 * | 2/2011 | Gyoda | 257/40 |

FOREIGN PATENT DOCUMENTS

| JP | A-2002-151254 | 5/2002 |
| JP | A-2008-66216 | 3/2008 |
| JP | A-2010-244696 | 10/2010 |

* cited by examiner

*Primary Examiner* — Allan R Wilson
(74) *Attorney, Agent, or Firm* — Oliff PLC

(57) ABSTRACT

A method of manufacturing an organic EL device according to the present application example includes forming a sealing layer by covering multiple organic EL elements and a connection terminal, forming a color filter as an organic layer that covers the sealing layer, patterning the color filter in such a manner that an opening extending up to the sealing layer is formed in a portion of the color filter, which overlaps the connection terminal, and etching the sealing layer in such a manner as to expose at least one part of the connection terminal with the pattern-formed color filter serving as a mask.

13 Claims, 19 Drawing Sheets

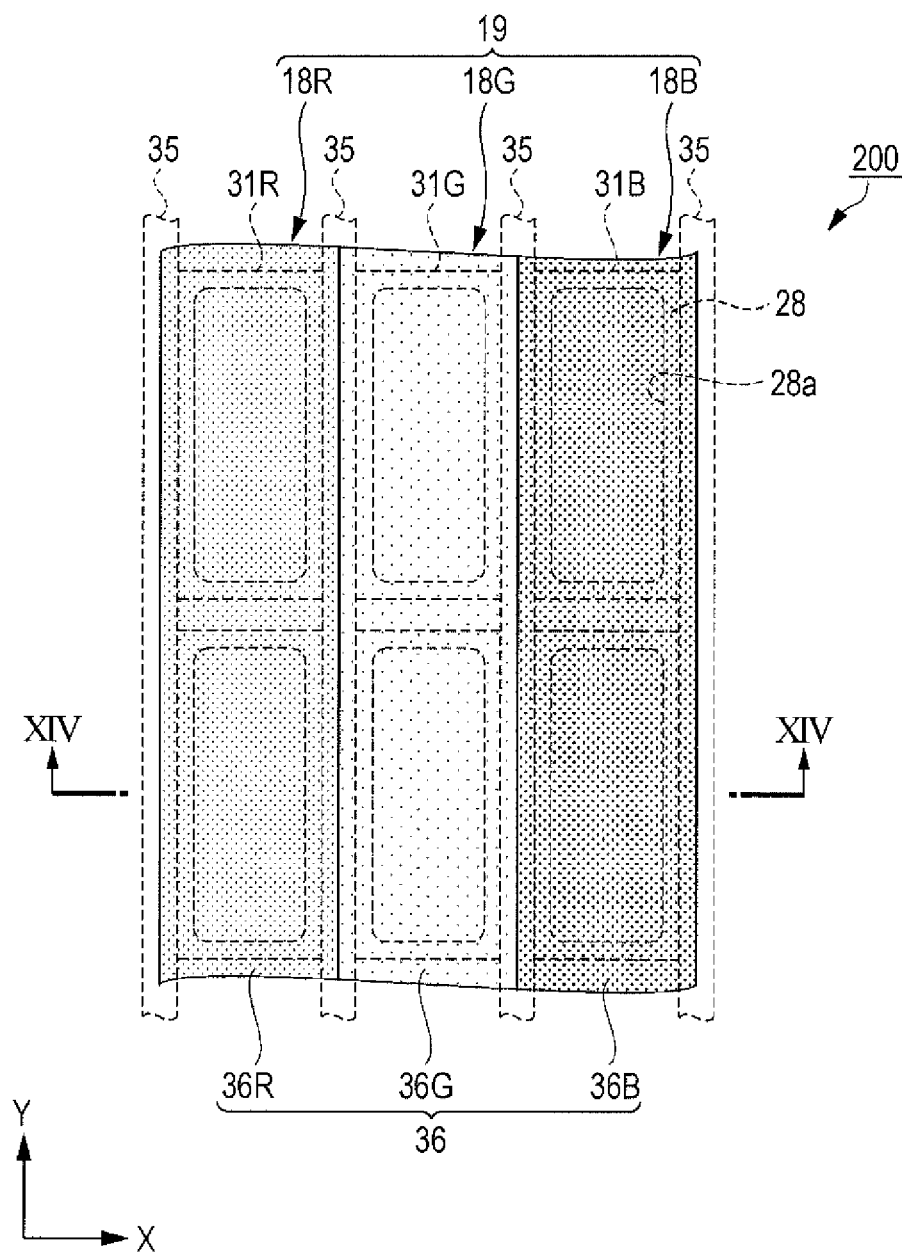

METHOD OF MANUFACTURING ORGANIC EL DEVICE, ORGANIC EL DEVICE AND ELECTRONIC APPARATUS

BACKGROUND

1. Technical Field

The present invention relates to a method of manufacturing an organic EL device equipped with an organic electroluminescence (EL) element, an organic EL device, and an electronic apparatus equipped with the organic EL device.

2. Related Art

An organic EL element is configured to have an anode, a cathode, and a functional layer including an organic light-emitting layer interposed between these electrodes. A functional layer emits light when energy, generated by re-combining a hole injected from the side of the anode and an electron injected from the side of the cathode in an organic light-emitting layer, is converted into fluorescence or phosphorescence. However, when water or oxygen penetrates into the functional layer through the anode or the cathode from the outside, injection of a carrier (the hole or the electron) into the organic light-emitting layer is prevented. This decreases luminance of light emission or causes the functional layer to degenerate and to lose a function of light emission. As a result of this, a so-called dark spot occurs.

In the organic EL device equipped with such an organic EL element, a sealing layer that covers the multiple organic EL elements is formed to prevent penetration of water, oxygen or others.

On the other hand, multiple connection terminals to which various wiring of the organic EL device is connected is provided in the organic EL device described above, in order to accomplish a connection to an external drive circuit. When forming the sealing layer, it is necessary to expose the connection terminal so that the connection terminal can be electrically used because the connection terminal is formed earlier than the sealing layer.

For example, in JP-A-2002-151254, a method of manufacturing an organic EL element is disclosed in which after forming a layered body that results from depositing an anode, an organic layer including a light-emitting layer, and a cathode, but before forming a protective film equivalent to the sealing layer, a surface of an electrode connection portion is reformed in such a manner that the electrode connection portion is not covered with the protective film.

Furthermore, for example, in JP-A-2010-244696, a method of manufacturing an organic EL device is disclosed that includes forming a first gas barrier layer, made from an inorganic material, which covers a light-emitting region including multiple organic EL element on an element substrate, using a plasma CVD method, and forming a second gas barrier layer in such a manner to overlap planarly with respect to the first gas barrier layer using an ion implanting method. In such a method of manufacturing an organic EL device, the first gas barrier layer and the second gas barrier layer are formed using a film formation mask that has an opening corresponding to a light-emitting region. To put it another way, since the connection terminal is covered with the film formation mask, the first gas barrier layer and the second gas barrier layer that are equivalent to the sealing layer are not formed on the connection terminal.

In the method of manufacturing an organic EL element, disclosed in JP-A-2002-151254, it is necessary to reform the surface of the electrode connection portion in advance. Because of this, there occurs a problem in that the manufacturing process becomes complex.

Furthermore, in the method of manufacturing an organic EL device, disclosed in JP-A-2010-244696, when the element substrate and the film formation mask are not set to a predetermined position, there is a concern that an inorganic material will be attached to the connection terminal. Therefore, the smaller is a portion on which the connection terminal is provided, the more difficult it is to align a position of the element substrate with a position of the film formation mask. In addition, at the time of a mass production, because it is necessary to remove the inorganic material attached to the film formation mask, this causes a problem in that the durability of the film formation mask is required.

SUMMARY

The invention can be realized in forms or application examples.

APPLICATION EXAMPLE 1

According to this application example, there is provided a method of manufacturing an organic EL device including multiple organic EL elements that are arranged on a substrate, and a connection terminal, the method including forming a sealing layer by covering the multiple organic EL elements and the connection terminal, forming an organic layer that covers the sealing layer, patterning the organic layer in such a manner that an opening extending up to the sealing layer is formed in a portion of the organic layer, which overlaps the connection terminal, and etching the sealing layer in such a manner as to expose at least one part of the connection terminal with the pattern-formed organic layer serving as a mask.

In this case, the sealing layer can be formed over an entire surface of the substrate without using a film formation mask. Furthermore, the portion of the sealing layer, which overlaps the connection terminal, is removed by the etching with the organic layer pattern-formed on the sealing layer serving as the mask. Therefore, since the portion of the sealing layer that overlaps the connection terminal is removed, it is unnecessary to prepare, for example, dispensing and patterning of dedicated photo resist, and it is possible to expose the connection terminal in an available state with a simple manufacturing process. That is, the method of manufacturing the organic EL device with high productivity can be provided.

APPLICATION EXAMPLE 2

In the method of manufacturing an organic EL device according to the application example, the organic EL device may include a color filter including coloration layers representing at least red, green, and blue on the sealing layer, and the organic layer may be formed as at least the coloration layer representing at least one color.

In this case, the portion of the sealing layer, which overlaps the connection terminal, can be removed by the etching with the coloration layer representing at least one color, formed in the forming of the coloration layers representing at least three colors, serving as a mask.

APPLICATION EXAMPLE 3

In the method of manufacturing an organic EL device according to the application example, the organic EL device may include a color filter including coloration layers representing at least red, green, and blue on the sealing layer, and the organic layer may be formed, as an insulation layer that differentiates between the coloration layers in terms of color, on the sealing layer.

In this case, the portion of the sealing layer, which overlaps the connection terminal, can be removed by the etching with the organic layer, as the insulation layer that differentiates between the coloration layers in terms of color, serving as the mask. Furthermore, since the coloration layers are differentiated by the organic layer from one another in terms of color when viewed from above, the organic EL device can be manufactured in which a color mixture and the like are improved in terms of view angle characteristics when compared to the case where the organic layer is not present.

APPLICATION EXAMPLE 4

In the method of manufacturing an organic EL device according to the application example, the organic EL device may include, sub-pixels that includes one of the multiple organic EL elements and which are provided corresponding to at least red, green, and blue, a pixel including the color-different sub-pixels, and a color filter including coloration layers representing at least red, green, and blue on the sealing layer, and the organic layer may be formed, as an insulation layer that differentiates between the coloration layers in terms of color and differentiates between the sub-pixels, on the sealing layer.

In this case, since the organic layer functions as the insulation layer that differentiates between the sub-pixels when viewed from above, the organic EL device can be manufactured in which a color mixture and the like are improved in terms of view angle characteristics when compared to the case where the organic layer is not present.

APPLICATION EXAMPLE 5

In the method of manufacturing an organic EL device according to the application example, in the etching of the sealing layer, the sealing layer may be anisotropically etched in a state where a protective member is arranged in such a manner as to face toward the color filter.

In this case, the portion of the sealing layer, which overlaps the connection terminal, can be removed with great precision by the etching without causing damage to the color filter due to the anisotropic etching.

APPLICATION EXAMPLE 6

The method of manufacturing an organic EL device according to the application example, may further include arranging an opposite substrate with respect to the color filter with a transparent resin layer in between, in which in the etching of the sealing layer, the sealing layer may be etched with the opposite substrate in between.

In this case, the portion of the sealing layer, which overlaps the connection terminal, can be removed by the etching using the opposite substrate that protects the color filter, without causing damage to the color filter due to the etching.

APPLICATION EXAMPLE 7

In the method of manufacturing an organic EL device according to the application example, the organic EL device may include a color filter including coloration layers representing at least red, green, and blue on the sealing layer, and the organic layer may be an overcoat layer that covers the color filter.

In this case, the portion of the sealing layer, which overlaps the connection terminal, can be removed by the etching with the overcoat layer covering the color filter serving as the mask.

APPLICATION EXAMPLE 8

In the method of manufacturing an organic EL device according to the application example, in the patterning of the organic layer, the opening portion may be formed in such a manner as to be opened over the multiple connection terminals.

In this case, the opening portion can be formed without needing great position precision. Furthermore, an arrangement pitch of the multiple connection terminals is small, and the multiple connection terminals can be easy to expose.

APPLICATION EXAMPLE 9

According to this application example, there is provided an organic EL device including multiple organic EL elements that are arranged on a substrate, a connection terminal, a sealing layer that covers the multiple organic EL elements and the multiple connection terminals, an organic layer that covers the sealing layer, and an opening portion that pierces through the organic layer and the sealing layer and exposes at least one part of the connection terminal.

In this case, the organic EL device can be provided that has high connection reliability without being influenced by the sealing layer or the organic layer.

APPLICATION EXAMPLE 10

The organic EL device according to the application example may further include a color filter, provided on the sealing layer, which includes coloration layers representing at least red, green, and blue, and which are arranged corresponding to the multiple organic EL elements, in which of the color filter, the organic layer is at least the coloration layer representing at least one color.

In this case, the organic EL device can be provided that has high connection reliability and excellent display quality by using the coloration layer representing at least one color without providing any special configuration as an organic layer.

APPLICATION EXAMPLE 11

The organic EL device according to the application example may further include a color filter, provided on the sealing layer, which includes coloration layers representing at least red, green, and blue, and which are arranged corresponding to the multiple organic EL elements, in which the organic layer may be an insulation layer that differentiates between the coloration layers in terms of color.

In this case, the organic EL device can be provided in which the color mixture and the like are improved in terms of view angle characteristics in addition to the high connection reliability.

APPLICATION EXAMPLE 12

The organic EL device according to the application example, may further include a color filter, provided on the sealing layer, which includes coloration layers representing at least red, green, and blue, and which are arranged corresponding to the multiple organic EL elements, in which the organic layer may be an overcoat layer that covers the color filter.

In this case, the organic EL device can be provided that has excellent durability quality in addition to the high connection reliability.

APPLICATION EXAMPLE 13

In the organic EL device according to the application example, the opening portion may be provided for every multiple connection terminals.

In this case, insulation between the connection terminals can be increased.

APPLICATION EXAMPLE 14

In the organic EL device according to the application example, the opening portion may be provided in such a manner that the multiple connection terminals are exposed within the opening portion.

In this case, formation precision demanded by the opening portion can be decreased.

APPLICATION EXAMPLE 15

According to this application example, there is provided an electronic apparatus including the organic EL device formed using the method of manufacturing an organic EL device according to the application examples described above.

In this case, the electronic apparatus can be provided in which high connection reliability and cost performance are realized.

APPLICATION EXAMPLE 16

According to this application example, there is provided an electronic apparatus including the organic EL device according to the application examples described above.

In this case, the electronic apparatus can be provided in which high connection reliability is realized.

BRIEF DESCRIPTION OF THE DRAWINGS

The invention will be described with reference to the accompanying drawings, wherein like numbers reference like elements.

FIG. 13 is a schematic cross-sectional diagram illustrating a configuration of a pixel of an organic EL device according to a third embodiment.

FIG. 20A is a schematic plan diagrams illustrating an insulation layer according to the modification example, FIG. 20B is a schematic cross-sectional diagram taken along a line XXB-XXB in FIG. 20A, and FIG. 20C is a schematic cross-sectional diagram taken along a line XXC-XXC in FIG. 20A.

DESCRIPTION OF EXEMPLARY EMBODIMENTS

Figure 1:
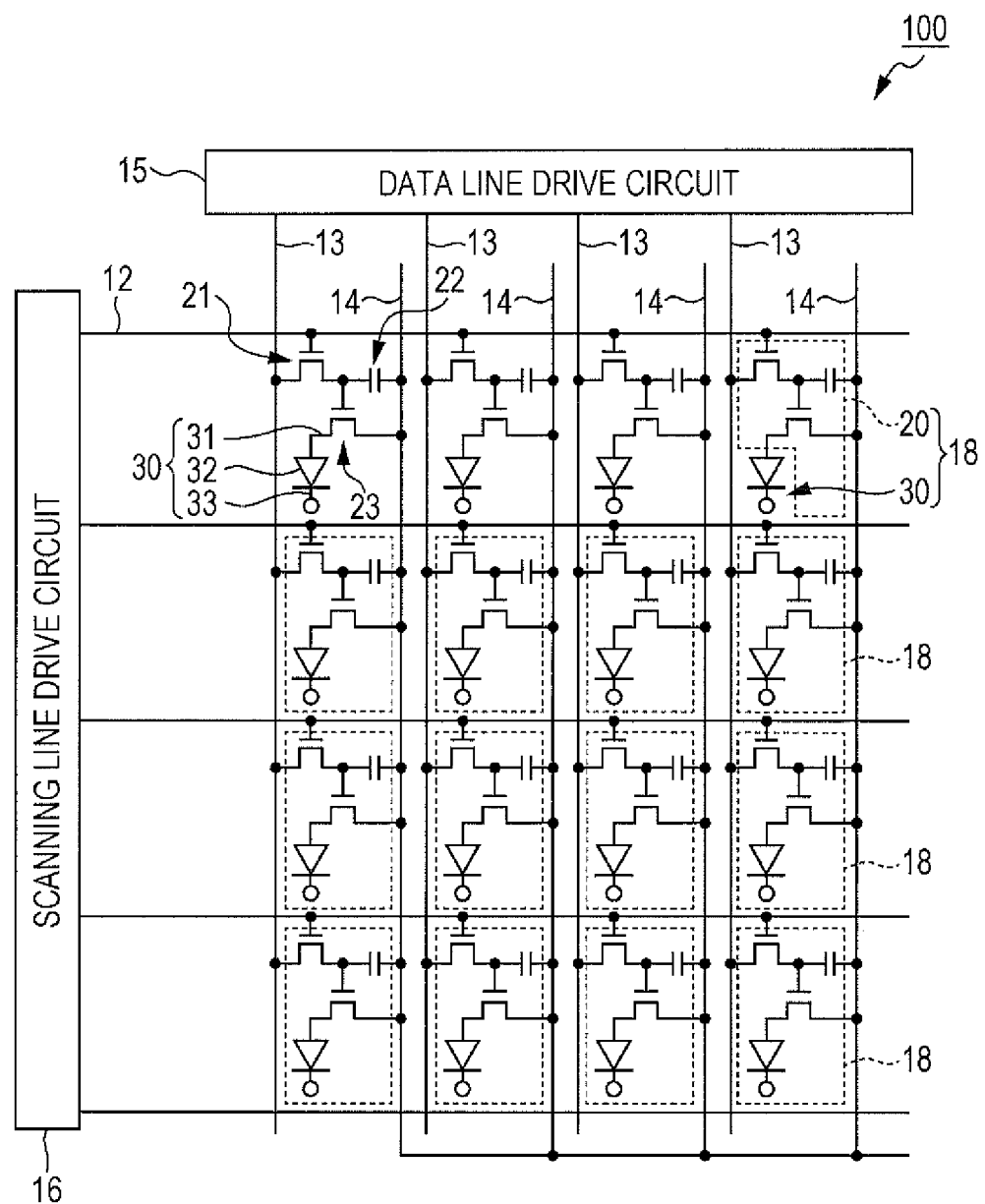
FIG. 1 is an equivalent circuit diagram illustrating an electrical configuration of an organic EL device according to a first embodiment.

Embodiments according to the invention are described below referring to the drawings. Moreover, the drawings referred to here illustrate described portions in such a manner that the portions are suitably enlarged or reduced to make them recognizable.

In addition, according to the embodiments that follow, for example, a case where the expression "on the substrate" is provided is defined to mean that a given component is arranged on the substrate in such a manner as to come into contact with the substrate, or that the given component is arranged on the substrate with another component in between, or that one part of the given component is arranged on the substrate in such a manner as to come into contact with the substrate, or that one part of the given component is arranged on the substrate with another component in between.

First Embodiment
Organic EL Device

Figure 2:
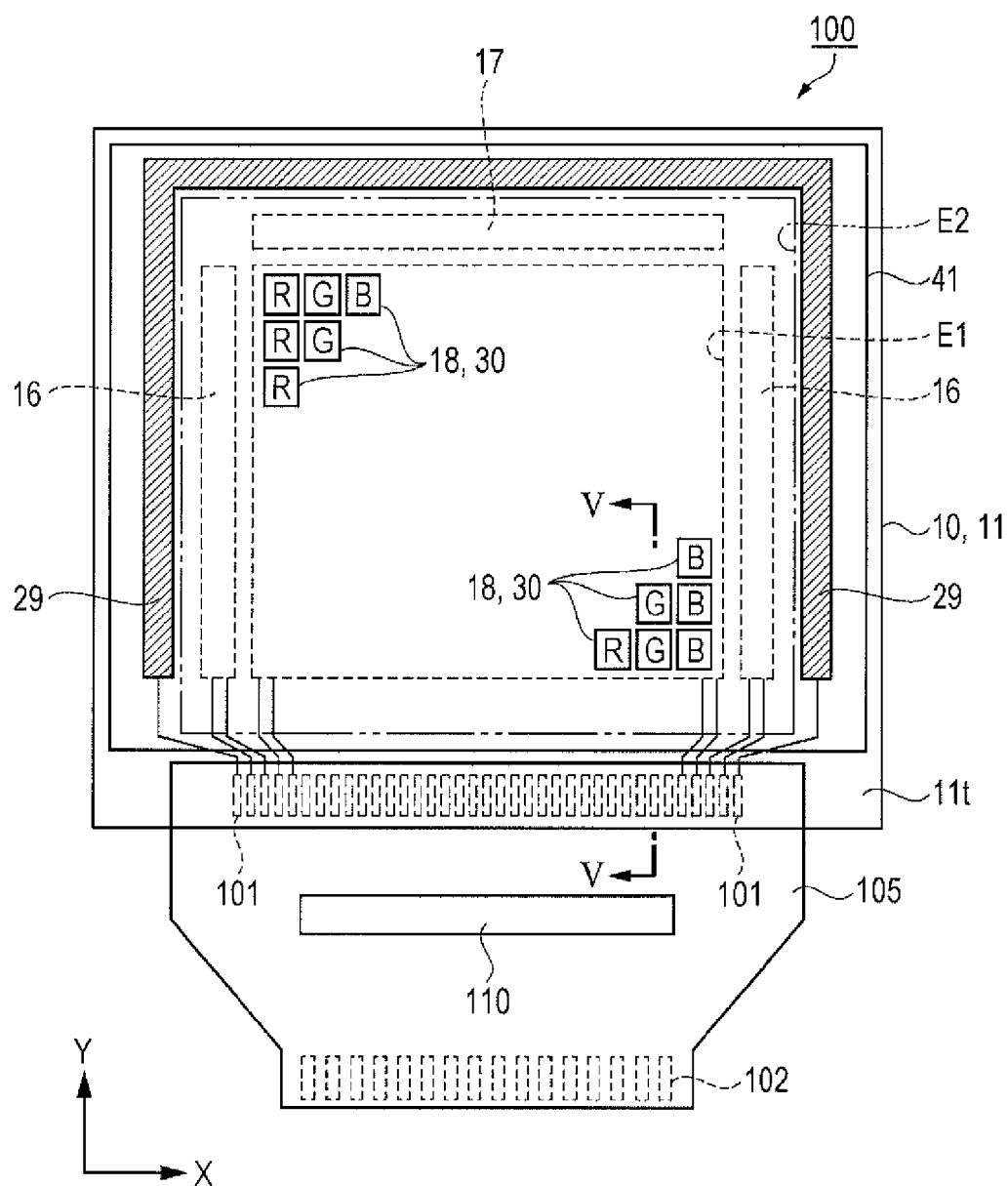
FIG. 2 is a schematic plan diagram illustrating a configuration of the organic EL device according to the first embodiment.
Figure 3:
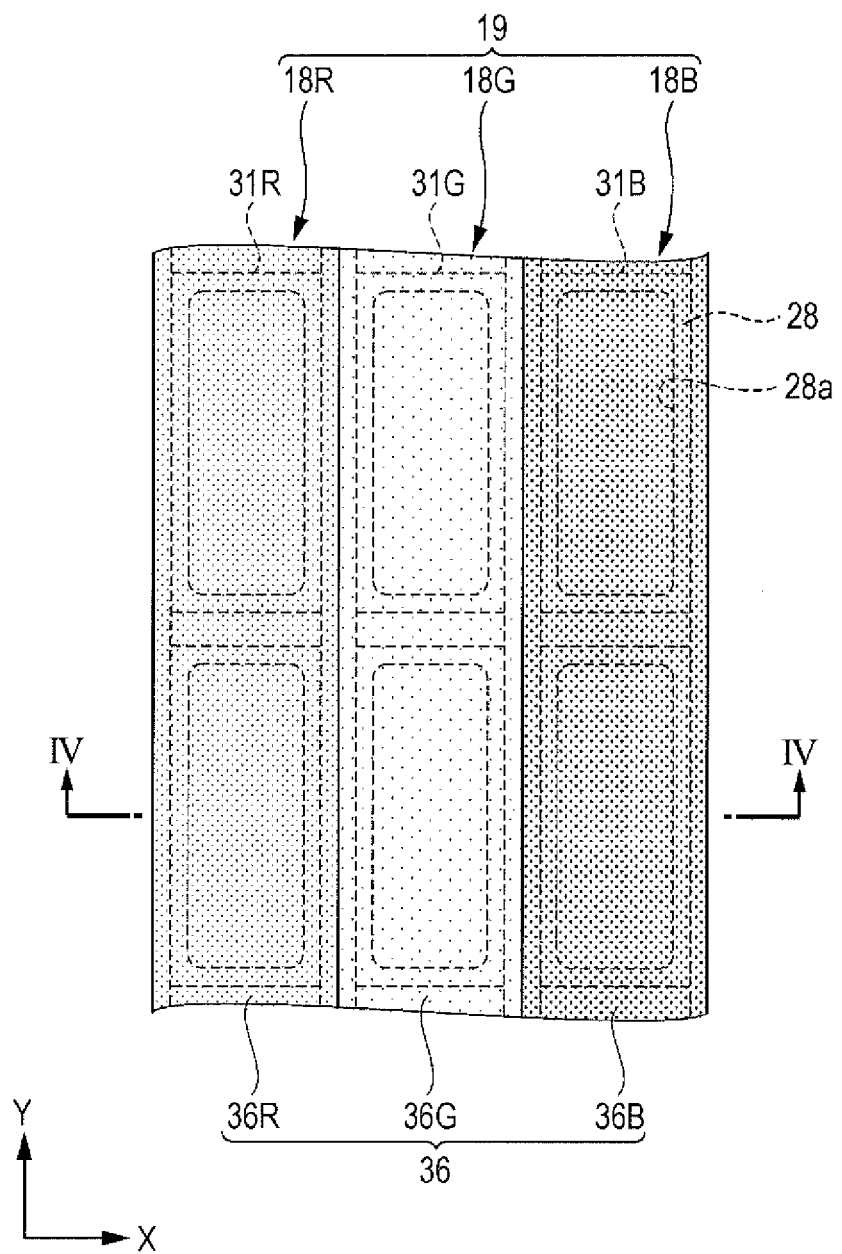
FIG. 3 is a schematic plan diagram illustrating an arrangement of pixels according to the first embodiment.

First, an organic electroluminescence (EL) device according to the present embodiment is described referring to FIGS. 1 to 3. FIG. 1 is an equivalent circuit diagram illustrating an electrical configuration of the organic EL device according to the first embodiment. FIG. 2 is a schematic plan diagram illustrating a configuration of the organic EL device according to the first embodiment. FIG. 3 is a schematic plan diagram illustrating an arrangement of pixels according to the first embodiment.

As illustrated in FIG. 1, the organic EL device 100 according to the present embodiment has multiple scan lines 12 and multiple data lines 13 that intersect one another and multiple power lines 14 that are arranged in parallel with the multiple data lines 13, respectively. The organic EL device 100 has a scan line drive circuit 16 to which the multiple scan lines 12 are connected and a data line drive circuit 15 to which the multiple data lines 13 are connected. Furthermore, the organic EL device 100 has multiple sub-pixels 18 that are arranged in the form of a matrix in such a manner they correspond to portions at which the multiple data lines 13 and the multiple scan lines 12 intersect one another, respectively.

The sub-pixel 18 has an organic EL element 30, a light emitting element and a pixel circuit 20 that controls drive of the organic EL element 30.

The organic EL element 30 has a pixel electrode 31, which functions as an anode, an opposite electrode 33, which functions as a cathode, and a functional layer 32, which includes an organic light-emitting layer provided between the pixel electrode 31 and the opposite electrode 33. Such an organic EL element 30 can expressed as a diode in terms of electricity.

The pixel circuit 20 includes a switching transistor 21, a capacitor 22, and a drive transistor 23. The two transistors 21 and 23, for example, can be configured from n-channel or p-channel thin film transistors (TFT) or MOS transistors.

A gate of the switching transistor 21 is connected to the scan line 12, one of a source and a drain is connected to the data line 13, and the other of the source and the drain is a gate of the drive transistor 23.

One of a source or a drain of the drive transistor 23 is connected to the pixel electrode 31 of the organic EL element 30, and the other of the source or the drain is connected to the power line 14.

The capacitor 22 is connected between a gate of the drive transistor 23 and the power line 14.

When the scan line 12 is driven and thus the switching transistor 21 is turned on, an electric potential is retained in the capacitor 22 through the switching transistor 21, based on an image signal supplied from the data line 13. It is determined whether the drive transistor 23 is turned on or turned off, depending on an electric potential of the capacitor 22, that is, a gate electric potential of the drive transistor 23. Then, when the drive transistor 23 is turned on, an amount of electric current according to the gate electric potential flows from the power line 14 to the functional layer 32 that is interposed between the pixel electrode 31 and the opposite electrode 33 through the drive transistor 23. The organic EL element 30 emits light, according to the amount of electric current that flows through the functional layer 32.

In addition, the pixel circuit 20 is not limited to this configuration. For example, the pixel circuit 20 may include a light emission control transistor that is provided between the pixel electrode 31 and the drive transistor 23 to control electric conduction between the pixel electrode 31 and the drive transistor 23.

As illustrated in FIG. 2, the organic EL device 100 has an element substrate 10 and an opposite substrate 41 that is arranged in such a manner as to face toward the element substrate 10. A display region E1 (which is indicated by dashed lines in the drawing) and a dummy region E2 (which is indicated by two-dot chain lines in the drawing) outside of the display region E1 are provided on the element substrate 10. A non-display region is outside of the dummy region E2.

The sub-pixels 18 are arranged in the form of a matrix on the display region E1. The sub-pixel 18, as described above, includes the organic EL element 30, the light emitting element. The sub-pixel 18 is configured in such a manner that emission of any of red (R) light, green (G) light, and blue (B) light can be obtained according to operations of the switching transistor 21 and the drive transistor 23.

According to the present embodiment, the sub-pixels 18 are arranged in such a so-called strip type that the sub-pixels 18 in each of which emission of light with the same color can be obtained are arranged in a first direction, and the sub-pixels 18 in each of which emission of color-different light can be obtained are arranged in a second direction intersecting (perpendicular to) the first direction. Descriptions are provided below with the first direction as a Y direction and the second direction as an X direction. In addition, in the element substrate 10, the arrangement of the sub-pixels 18 is not limited to the stripe type, but may be made by employing a mosaic type or a delta type.

A peripheral circuit, which is for mainly causing the organic EL element 30 of each sub-pixel 18 to emit light, is provided on the dummy region E2. For example, as illustrated in FIG. 2, a pair of scan line drive circuits 16 is provided in such a manner as to extend in the Y direction. The display region E1 is interposed between the pair of scan line drive circuits in the X direction. An inspection circuit 17 is provided along the display region E1 between the pair of scan line drive circuits 16.

A wiring layer 29 is arranged on the element substrate 10 in such a manner that the wiring layer 29 extends in the Y direction along the pair of scan line drive circuit 16 and in the X direction along the inspection circuit 17 and thus surrounds the dummy region E2. The organic EL element 30 of the opposite electrode 33 is formed as a common cathode over the multiple organic EL elements 30, that is, the sub-pixels 18. Furthermore, the opposite electrode 33 is formed in such a manner as to start from the display region E1 and reach the non-display region and thus is electrically connected to the wiring layer 29 in the non-display region.

The element substrate 10 is greater in size than the opposite substrate 41. Thus, the multiple connection terminals 101 for establishing electric connection to an external drive circuit are arranged in the X direction, on one peripheral portion that protrudes when viewed in the Y direction from the opposite substrate 41 (which is a peripheral portion between an end portion of the substrate 10 and the dummy region E2 in the lower portion of the drawing and is hereinafter referred to as a terminal portion 11t). A flexible circuit substrate (FPC) 105 is connected to the multiple connection terminals 101. A drive IC 110 is built into the FPC 105. The drive IC 110 includes the data line drive circuit 15 described above. The FPC 105 has an input terminal 102 that is connected to an input side of the drive IC 110 through wiring and an output terminal (its illustration is omitted) that is connected to an output side of the drive IC 110 through the wiring. The data line 13 and the power line 14 on the element substrate 10 are electrically connected to the drive IC 110 through the connection terminal 101 and the FPC 105. The wiring that is connected to the scan line drive circuit 16 and the inspection circuit 17 is electrically connected to the drive IC 110 through the connection terminal 101 and the FPC 105. Furthermore, the opposite electrode 33 as the common cathode is also electrically to the drive IC 110 through the wiring layer 29 and the connection terminal 101, and the FPC 105. Therefore, a control signal, a drive electric potential (VDD), and the like are supplied from the drive IC 110 to any one of the multiple connection terminals 101 that are arranged on the terminal portion 11t. A well-known method can be used as a method to make electrical connection between the multiple connection terminals 101 on the element substrate 10 and the output terminal on the FPC 105. Examples include a method to use a thermoplastic anisotropic conductive film and a method to use a thermal curing anisotropic adhesive.

Next, a configuration and a plane arrangement of the sub-pixels 18 are described referring to FIG. 3. The organic EL device 100 according to the present embodiment is configured from a combination of the organic EL element 30 in which emission of white light can be obtained and a color filter 36 including red (R), green (G), and blue (B) coloration layers.

As illustrated in FIG. 3, the sub-pixel 18R in which emission of red (R) light can be obtained, the sub-pixel 18G in which emission of green (G) light can be obtained, and the sub-pixel 18B in which emission of blue (B) light can be obtained are arranged in the X direction. The sub-pixels 18 in each of which emission of light with the same color can be obtained are arranged in the Y direction. The configuration is provided in which the three sub-pixels 18R, 18G, and 18B arranged in the X direction are represented as one pixel 19.

According to the present embodiment, an arrangement pitch of the sub-pixels 18R, 18G, and 18B in the X direction is less than 5 μm. The sub-pixels 18R, 18G, and 18B are arranged by a space of 0.5 μm to 1.0 μm in the X direction. The arrangement pitch of the sub-pixel 18R, 18G, and 18B in the Y direction is less than approximately 10 μm.

The pixel electrode 31 in the sub-pixel 18 is in a substantially rectangular shape and the longitudinal direction of the pixel electrode 31 is in parallel with the Y direction. The pixel electrode 31 is referred to as the pixel electrodes 31R, 31G, and 31B to provide correspondence with light emission colors. A film is formed to cover an edge of each of the pixel electrodes 31R, 31G, and 31B and then a partition wall 28 is formed by processing the film. By doing this, an opening portion 28a is formed on each of the pixel electrodes 31R, 31G, and 31B, and within the opening portion 28a provided in the partition wall 28, each of the pixel electrodes 31R, 31G, and 31B is in contact with the functional layer 32. Furthermore, a plane shape of the opening portion 28a is also substantially rectangular. In addition, the substantially rectangular shape includes a rectangular shape, a rectangular shape of which corners are round, a rectangular shape of which short sides are curved, and the like.

The red (R) coloration layer 36R of the color filter 36 is formed in such a manner as to overlap the multiple pixel electrodes 31R that are arranged in the Y direction. The green (G) coloration layer 36G is formed in such a manner as to overlap the multiple pixel electrodes 31G that are arranged in the Y direction. The blue (B) coloration layer 36B is formed in such a manner as to overlap the multiple pixel electrodes 31B that are arranged in the Y direction. To put it another way, the color-different color coloration layers 36R, 36G, and 36B are extended in the Y direction and thus are formed in the form of a stripe and further are formed in such a manner as to come into contact with one another in the X direction.

Figure 4:
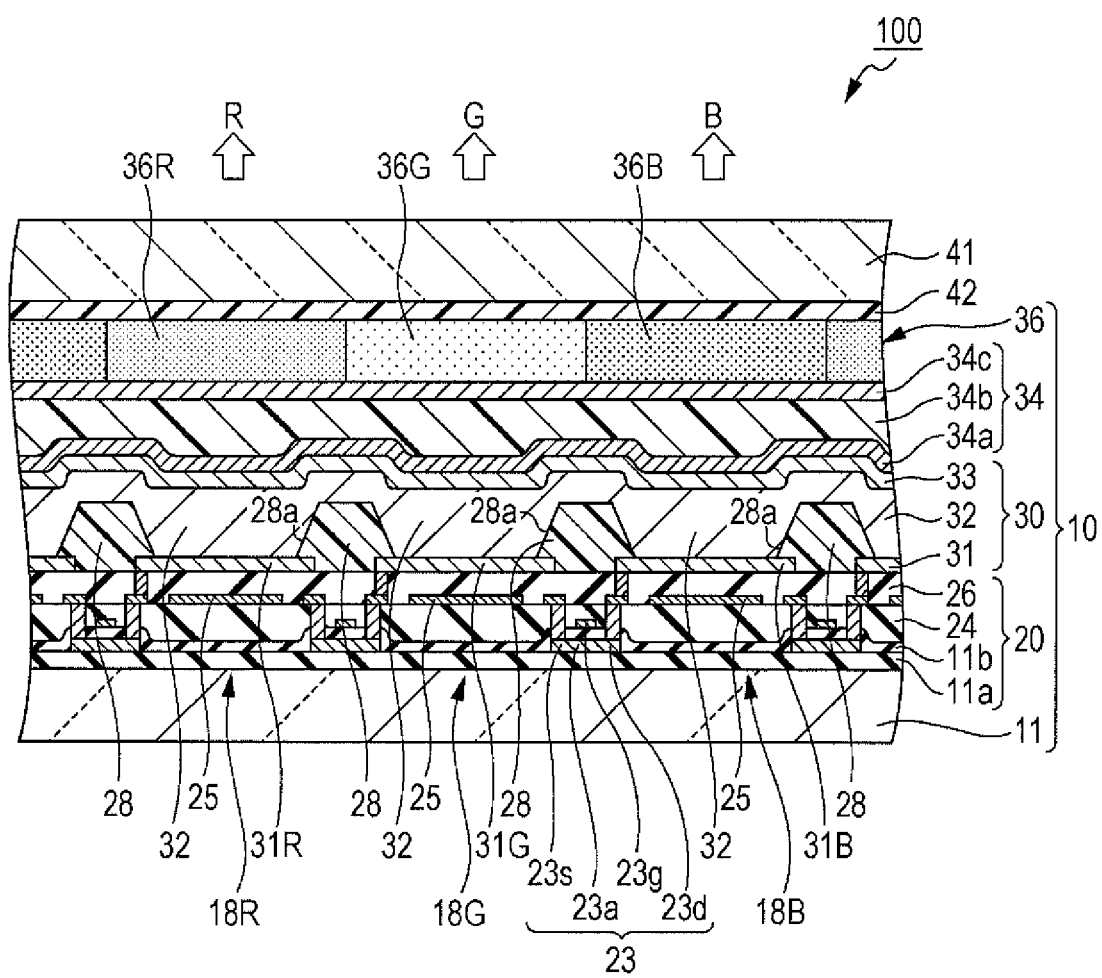
FIG. 4 is a schematic cross-sectional diagram illustrating a construction of the organic EL device, taken along a line IV-IV in FIG. 3.
Figure 5:
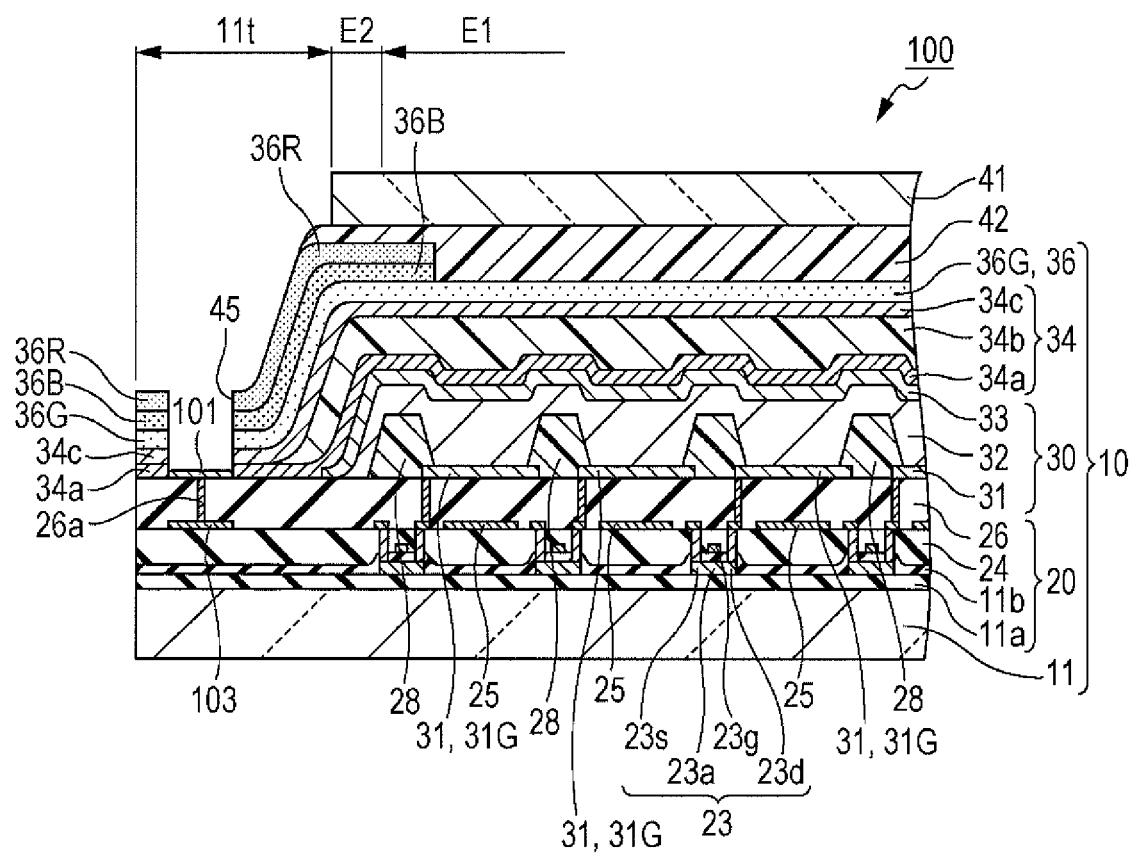
FIG. 5 is a schematic cross-sectional diagram illustrating the construction of the organic EL device, taken along a line V-V in FIG. 2.

Next, a construction of the organic EL device 100 is described referring FIGS. 4 and 5. FIG. 4 is a schematic cross-sectional diagram illustrating the construction of the organic EL device, taken along a line IV-IV in FIG. 3. FIG. 5 is a schematic cross-sectional diagram illustrating the construction of the organic EL device, taken along a line V-V in FIG. 2. FIG. 4 illustrates a construction of the sub-pixel 18 in the display region E1. FIG. 5 illustrates a construction of the terminal portion 11t.

As illustrated in FIG. 4, the organic EL device 100 includes an element substrate 10 including a base substrate 11, and the pixel circuit 20, the organic EL element 30, a sealing layer 34 sealing the multiple organic EL element 30, and the color filter 36, all of which are formed in this sequence on the base substrate 11. Furthermore, the organic EL device 100 includes the opposite substrate 41 that faces toward the element substrate 10.

The opposite substrate 41, for example, is made from a transparent substrate such as glass, and is arranged in such a manner as to face toward the element substrate 10 with a transparent resin layer 42 in between in order to protect the color filter 36 formed on the sealing layer 34.

The light emitted from the functional layer 32 of the sub-pixels 18R, 18G, and 18B is reflected from a reflection layer 25 described below and passes through the color filter 36, resulting in being projected from the opposite substrate 41. That is, the organic EL device 100 is a top emission type light emitting apparatus.

As the base substrate 11, a transparent substrate such as glass an opaque substrate such as silicon or ceramic can be used because the organic EL device 100 is a top emission type. A case where a thin film transistor is used in the pixel circuit 20 is described below.

A film is formed to cover a surface of the base substrate 11 and then a first insulation film 11a is formed by processing the film. In the pixel circuit 20, for example, a semiconductor layer 23a of the drive transistor 23 is formed on the first insulation film 11a. A film is formed to cover the semiconductor layer 23a, and then a second insulation film 11b, which functions as a gate insulation film, is formed by processing the film. A gate electrode 23g is formed in a position that faces toward a channel region of the semiconductor layer 23a with the second insulation film 11b in between. A film is formed to cover the gate electrode 23g and then thus a first interlayer insulation film 24 is formed by processing the film to a film thickness ranging from 300 nm to 2 μm. Flattening processing is performed on the first interlayer insulation film 24 in order to remove surface irregularity that occurs by covering, for example, the drive transistor 23 of the pixel circuit 20. Contact holes, which pierce through the second insulation film 11b and the first interlayer insulation film 24, are formed to correspond to a source region 23s and a drain region 23d of the semiconductor layer 23a, respectively. A conductive film is formed in such a manner as to fill the contact holes and is patterned, and thus an electrode and wiring that are connected to the drive transistor 23 are formed. Furthermore, the conductive film is formed with a reflective metal such as aluminum, or alloy of aluminum and Ag (silver) or Cu (copper), and the reflection layer 25, independent of the sub-pixel 18, is formed by patterning the formed conductive film. Although their illustration is omitted in FIG. 4, in the pixel circuit 20, the switching transistor 21 and the capacitor 22 are also formed on the base substrate 11.

A film is formed to cover the reflection layer 25 and the first interlayer insulation film 24 and then a second interlayer insulation film 26 is formed by processing the film to a film thickness ranging from 10 nm to 2 μm. Furthermore, the contact holes for establishing electrical connection between the pixel electrode 31 and the drive transistor 23 are formed later by piercing through the second interlayer insulation film 26. For example, silicon oxide, silicon nitride, or silicon oxynitride can be used as a material that makes up the first insulation film 11a, the second insulation film 11b, the first interlayer insulation film 24, and the second interlayer insulation film 26.

A film is formed to cover the second interlayer insulation film 26 and then a conductive film is film-formed by processing the film in such a manner as to fill the contact holes formed on the second interlayer insulation film 26. Then, the pixel electrodes 31 (31R, 31G, and 31B) is formed by patterning the conductive film. The pixel electrode 31 (31R, 31R, and 31B) is formed with a transparent conductive film such as indium tin oxide (ITO). In addition, if the reflection layer 25 is not provided in the sub-pixel 18, the pixel electrode 31 (31R, 31G, and 31B) may be formed with a metal with light reflection such as aluminum or aluminum alloy.

A film is formed to cover an edge portion of each of the pixel electrodes 31R, 31G, and 31B, and then partition wall 28 is formed by processing the film. By doing this, the opening portion 28a is formed in the pixel electrodes 31R, 31G, and 31B. The partition wall 28 is formed with acrylic-based photo-resistive resin in such a manner that the pixel electrodes 31R, 31G, and 31B result from the partitioning at a height of approximately 1 µm.

In addition, according to the present embodiment, the partition wall 28, made from the photo-resistive resin, is formed to make the pixel electrodes 31R, 31G, and 31B insulated from one another, but the pixel electrodes 31R, 31G, and 31B may result from the partitioning through the use of an inorganic insulation material such as silicon oxide.

The functional layer 32 is formed by using a vapor phase process such as a vacuum deposition method or an ion implantation method in such a manner to come into contact with the pixel electrodes 31R, 31G, and 31B, a surface of the partition wall 28 also is covered with the functional layer 32. In addition, the functional layer 32 is not necessary to cover an entire surface of the partition wall 28, and because if the functional layer 32 is formed on the region partitioned by the partition wall 28, this is sufficient, a top portion of the partition wall 28 is not necessary to be covered with the functional layer 32.

The functional layer 32, for example, includes a hole injection layer, a hole transport layer, an organic light-emitting layer, and an electron transport layer. According to the present embodiment, the hole injection layer, the hole transport layer, the organic light-emitting layer, and the electron transport layer are film-formed with respect to the pixel electrode 31 and deposited in this sequence, using the vapor phase process, thereby forming the functional layer 32. In addition, the functional layer 32 is not limited to this configuration, but may include an intermediate layer that controls movement of electrons that are carriers.

The organic light-emitting layer may have a configuration in which emission of white light can be obtained and, for example, can employ a configuration in which the organic light-emitting layer in which emission of red light can be obtained, the organic light-emitting layer in which emission of green light can be obtained, and the organic light-emitting layer in which emission of blue light can be obtained are combined.

A film is formed to cover the functional layer 32, and the opposite electrode 33 is formed as the common cathode by processing the film. For example, an alloy of Mg and Ag is film-formed to such an extent of film thickness (for example 10 nm to 30 nm) that light transmittance and light reflection can be obtained, and the opposite electrode 33 is formed by processing the formed film. By doing this, the multiple organic EL elements 30 are completed.

By forming the opposite electrode 33 into a state where it has light transmittance and light reflection, an optical resonator may be configured from the reflection layer 25 and the opposite electrode 33 for every sub-pixels 18R, 18G, and 18B. The optical resonator causes light with a specific resonant wavelength to be projected, by causing an optical distance between the reflection layer 25 and the opposite electrode 33 to differ for every sub-pixels 18R, 18G, and 18B. By doing this, color purity of light emitted from each of the sub-pixels 18R, 18G, and 18B can be increased. The optical distance is obtained as a sum of products of reflective indexes and film thicknesses of various functional films that are interposed between the reflection layer 25 and the opposite electrode 33 that makes up the optical resonator. Therefore, as a method for causing the optical distance for every sub-pixels 18R, 18G, and 18B, there are a way of causing film thicknesses of the pixel electrodes 31R, 31G, and 31B to differ and a way of causing a film thickness of the second interlayer insulation film 26 between the reflection layer 25 and the pixel electrodes 31R, 31G, and 31B.

Next, the sealing layer 34, which covers the multiple organic EL elements 30, is formed in such a manner as to prevent water or oxygen from penetrating. The sealing layer 34 according to the present embodiment results from depositing a first sealing layer 34a, a buffer layer 34b, and a second sealing layer 34c in this sequence, starting from the side of the opposite electrodes 33.

For example, an inorganic material with light transmittance and excellent gas barrier property, such as silicon oxynitride (SiON), may be used for formation of the first sealing layer 34a and the second sealing layer 34c.

A vacuum deposition method and a sputter method can be enumerated as examples of a method of forming the first sealing layer 34a and the second sealing layer 34c. The excellent gas barrier property can be realized by increasing the film thicknesses of the first sealing layer 34a and the second sealing layer 34c, but a crack is easy to occur in one of them. Therefore, the film thickness may be controlled to approximately 200 nm to 400 nm. According to the present embodiment, the excellent gas barrier property is realized by superimposing one of the first sealing layer 34a the second sealing layer 34c on the other with the buffer layer 34b interposed in between.

The buffer layer 34b can be formed, for example, with epoxy-based resin or a dispensing-type inorganic material (silicon oxide) that is excellent in thermal stability. Furthermore, if the buffer layer 34b is dispense-formed using a printing method such as a screen or a fixed-amount discharge method, a surface of the buffer layer 34b can be flattened. To put it another way, the buffer layer 34b can function as a flattening layer that alleviates surface irregularity of the first sealing layer 34a. The buffer layer 34b is 1 µm to 5 µm in thickness.

The coloration layers 36R, 36G, and 36B, which correspond to the sub-pixels 18R, 18G, and 18B corresponding to red, green, and blue, respectively, are formed on the sealing layer 34. As an example of a method of forming the color filter 36 including the coloration layers 36R, 36G, and 36B, a method is enumerated in which a photo-sensitive resin layer is formed by dispensing a photo-sensitive material including a coloring material and the formed photo-sensitive resin layer is exposed and developed using a photo lithography technique. The film thicknesses of the coloration layer 36R, 36G, and 36B may be the same and may be different such that at least one color is distinguishable from the others.

The element substrate 10 and the opposite substrate 41 are arranged with a space in between in such a manner as to face toward each other, and the transparent resin layer 42 results from filling the space with a transparent resin material. Urethane-based, acrylic-based, epoxy-based, and polyolefin-based resin materials can be enumerated as examples of the transparent resin material. The transparent resin layer 42 is 10 μm to 100 μm in thickness.

Next, constructions of the terminal portion 11t of the element substrate 10 and of a periphery of the terminal portion 11t are described referring to FIG. 5. As illustrated in FIG. 5, in the terminal portion 11t of the element substrate 10, the connection terminal 101 is formed on the second interlayer insulation film 26, in the same manner as the pixel electrode 31. Furthermore, the connection terminal 101 is connected to wiring layer 103 formed on the first interlayer insulation film 24, with the conductive film within the contact hole 26a formed on the second interlayer insulation film 26 in between. In FIG. 5, illustrations of a configuration of the pixel circuit 20 and signal wiring connected to the pixel circuit 20 on the base substrate 11, and of a configuration of a peripheral circuit such as the scan line drive circuit 16, are omitted, but each of the multiple connection terminals 101 is electrically connected to the circuits and the signal wiring through the wiring layer 103.

The wiring layer 103 may be patterned using the conductive film formed on the first interlayer insulation film 24, along with the reflection layer 25, but may be formed with a material different from a material making up the reflection layer 25.

The connection terminal 101 may be patterned using the conductive film formed on the second interlayer insulation film 26, along with the pixel electrode 31, but may be formed with a material different from a material making up the pixel electrode 31.

The first sealing layer 34a, the second sealing layer 34c, the coloration layer 36G, the coloration layer 36B, and the coloration layer 36R are deposition-formed in this sequence on the terminal portion 11t of the element substrate 10, and an opening portion 45, which pierces through such layers, is formed on the connection terminal 101. Such layers are not formed on at least one part of the connection terminal 101, and the connection terminal 101 is exposed within the opening portion 45.

In other words, the first sealing layer 34a and the second sealing layer 34c, which are made from the inorganic material, of the sealing layer 34, are formed in such a manner as to cover not only the multiple organic EL elements 30 (refer to FIG. 2) but also the terminal portion 11t. With regard to the color filter 36, the coloration layers 36R, 36G, and 36B are formed corresponding to the sub-pixels 18R, 18G, and 18B, respectively, in the following sequence: green (G), blue (B), red (R), and any one of the coloration layers 36R, 36G, and 36B are formed in such a manner to cover not only the display region E1 but also the terminal portion 11t. Then, the opening portion 45 is formed in such a manner as to pierce through the first sealing layer 34a, the second sealing layer 34c, the coloration layer 36G, the coloration layer 36B, and the coloration layer 36R. To put it another way, one example corresponding to an organic layer according to the invention is the color filter 36.

The three coloration layers 36R, 36G, and 36B are formed in such a manner they extend to over the partition wall 28 positioned in border portions of the dummy region E2 (refer to FIG. 2) and the display region E1, starting from an edge of the terminal portion 11t, which faces toward the outside boundary of the element substrate 10. The coloration layers 36R, 36G, and 36B are protected by the opposite substrate 41 with the transparent resin layer 42 in between.

By defining the construction of the terminal portion 11t and the periphery thereof in this manner, the connection terminal 101 is exposed within the opening portion 45 and thus can be electrically connected to the FPC 105. Furthermore, on the side of the element substrate 10, when the color filter 36 is formed only within the display region E1, wettability with respect to the transparent resin material making up the transparent resin layer 42 changes due to a portion in which the color filter 36 is formed and a portion in which the color filter 36 is not formed. In such a case, there is a concern that a defect will occur in that when the element substrate 10 and the opposite substrate 41 are arranged in such a manner as to face toward each other with the transparent resin layer 42 in between, dispense irregularity of the transparent resin material occurs and thus the transparent resin material excessively protrudes from the opposite substrate 41, or a gap occurs between the element substrate 10 and the opposite substrate 41. According to the present embodiment, the color filter 36 is successively formed from the display region E1 to an edge of the terminal portion 11t. Then, an area where the color filter 36 is arranged is more increased than an area where the color filter 36 and the transparent resin layer 42 comes into contact with each other. In other words, the defect described above is difficult to occur because an end portion of the color filter 36 is made to be positioned between an end portion of the transparent resin layer 42 and an edge of the base substrate 11.

If the transparent resin material does not protrude excessively from the opposite substrate 41, because a dimensional tolerance for the protrusion of the transparent resin material is unnecessary to take into consideration in designing the terminal portion 11t, it is possible to provide or manufacture the organic EL device 100 that is made small in size without changing a size of the display region E1.

Method of Manufacturing the Organic EL Device

Figure 6:
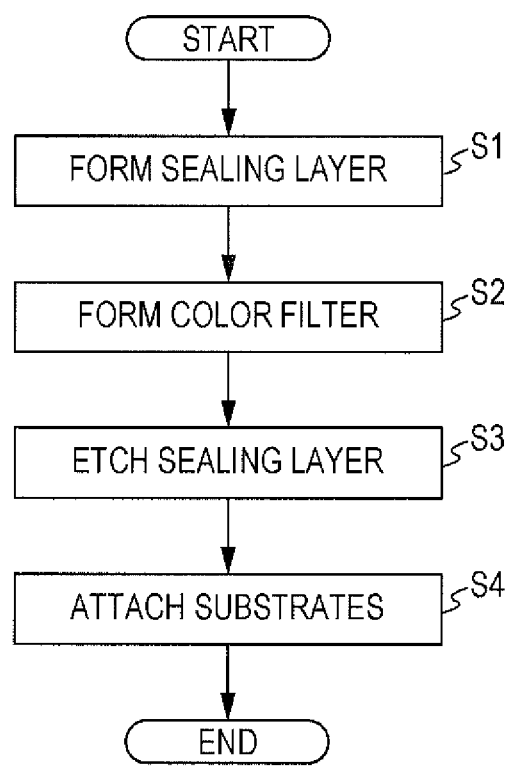
FIG. 6 is a flowchart illustrating a method of manufacturing the organic EL device according to the first embodiment.
Figure 7A:
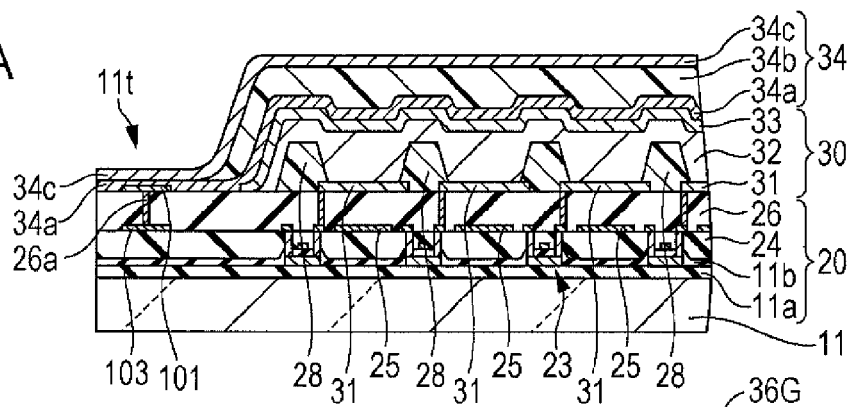
FIGS. 7A to 7D are schematic cross-sectional diagrams illustrating the method of manufacturing the organic EL device according to the first embodiment.
Figure 7B:
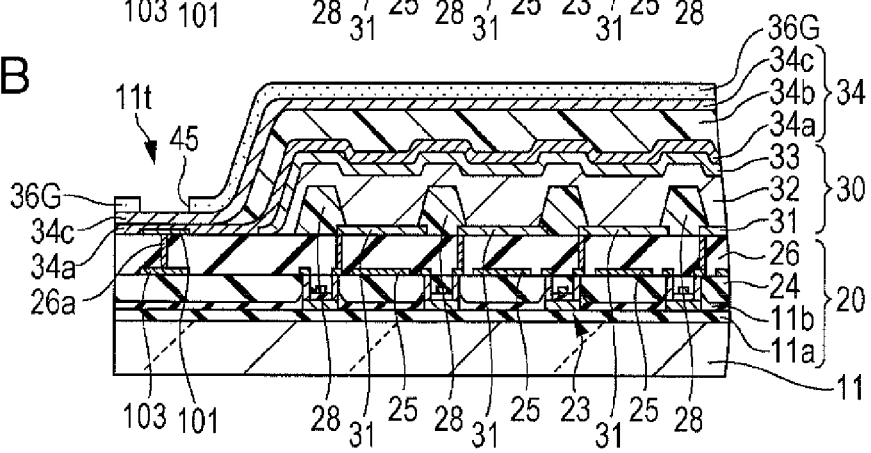
Figure 7C:
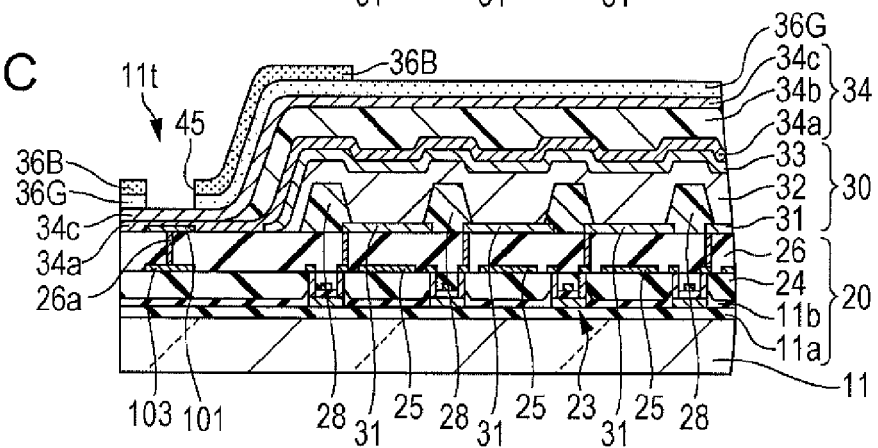
Figure 7D:
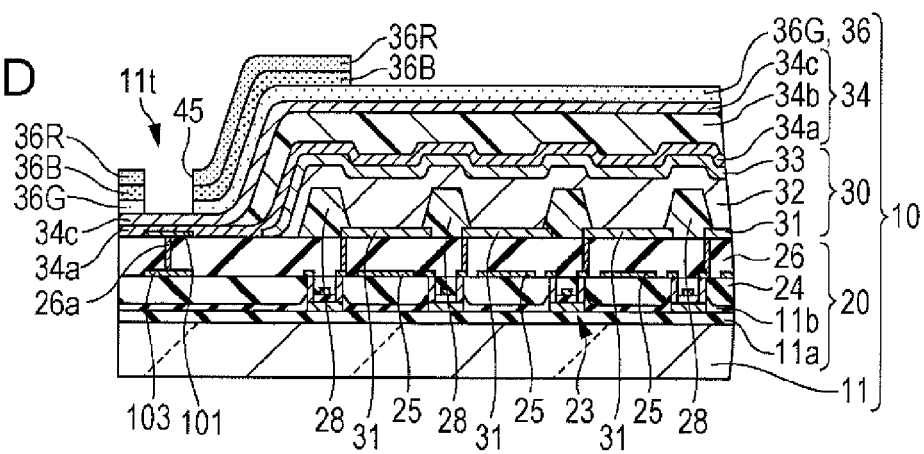
Figure 8A:
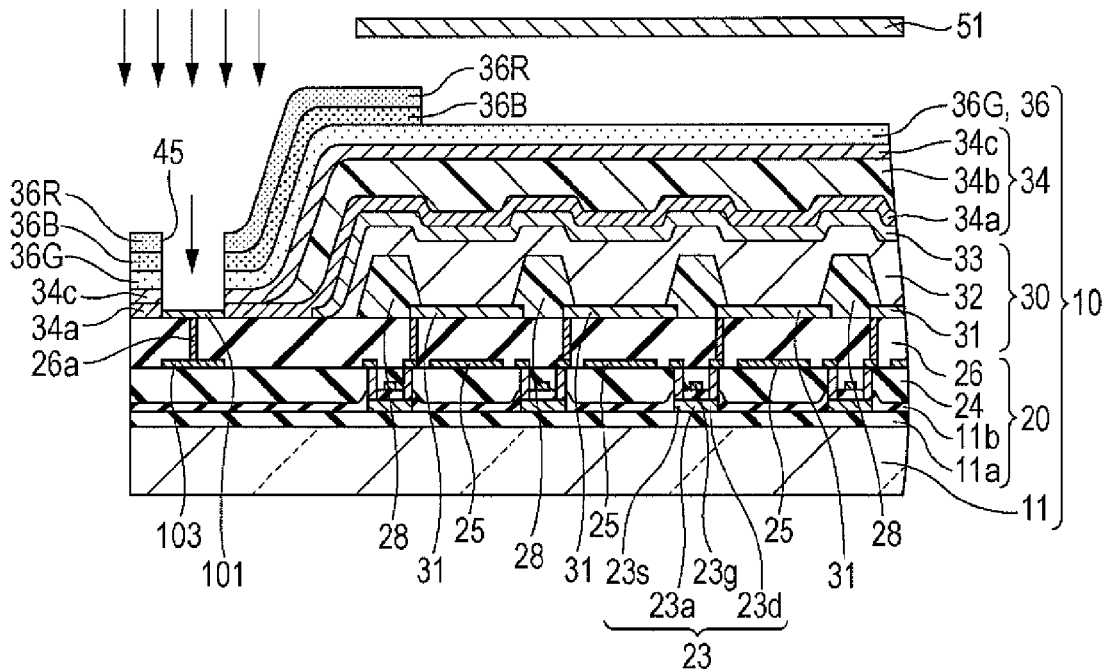
FIGS. 8A and 8B are schematic cross-sectional diagrams illustrating the method of manufacturing the organic EL device according to the first embodiment.
Figure 8B:
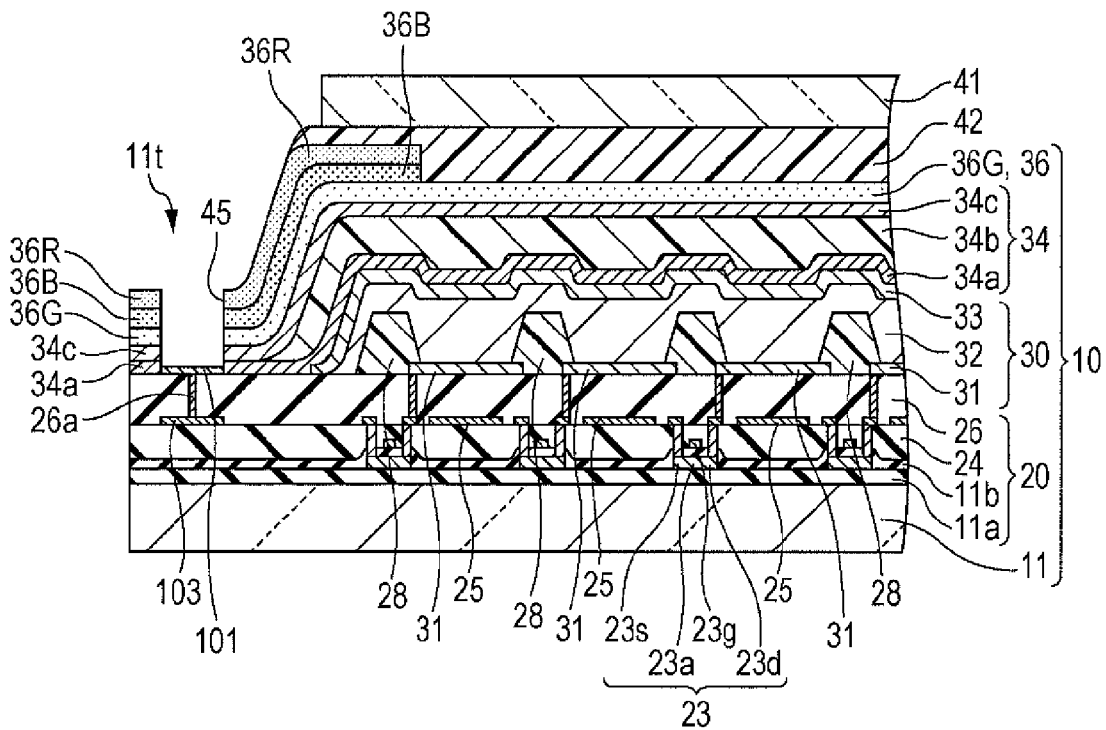
Figure 9:
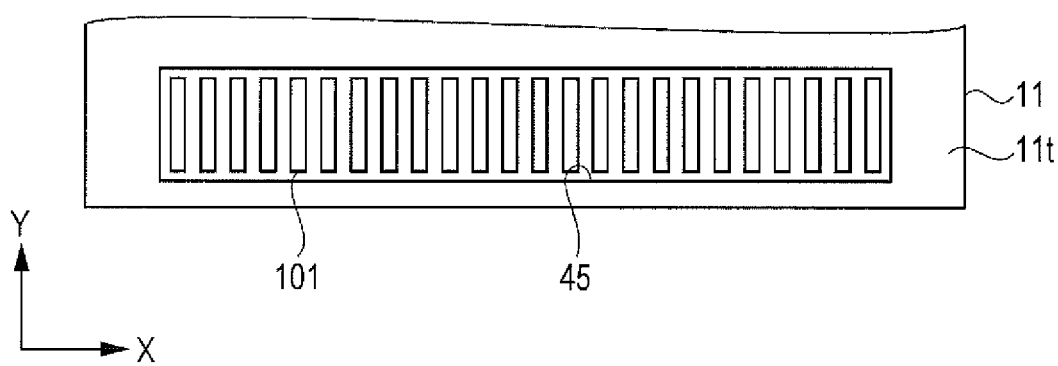
FIG. 9 is a schematic plan diagram illustrating a relationship between a connection terminal and an opening portion in a terminal portion.

Next, with regard to a method of manufacturing the organic EL device according the present embodiment, a method of forming the opening portion 45 that exposes the connection terminal 101 that is a characterizing portion according to the invention is described in detail referring to FIGS. 6 to 9. FIG. 6 is a flowchart illustrating the method of manufacturing the organic EL device. FIGS. 7A to 7D and FIGS. 8A and 8B are schematic cross-sectional diagrams illustrating the method of manufacturing the organic EL device. FIG. 9 is a schematic plan diagram illustrating a relationship between the connection terminal and the opening portion in the terminal portion. In addition, FIGS. 7A to 7D and FIGS. 8A and 8B are cross-sectional diagrams corresponding to FIG. 5.

As illustrated in FIG. 6, the method of manufacturing the organic EL device 100 according to the present embodiment includes forming the sealing layer (Step S1), forming the color filter (Step S2), etching the sealing layer (Step S3), and attaching the substrates (Step S4).

In addition, a well-known method can be employed as a method of forming the pixel circuit 20, the peripheral circuit, the signal wiring, the reflection layer 25, the organic EL element 30 and the like on the base substrate 11.

In the forming of the sealing layer (Step S1) in FIG. 6, as illustrated in FIG. 7A, first, the first sealing layer 34a is formed that covers the opposite electrode 33 and the terminal portion 11t. A method of depositing silicon oxynitride (SiON) in a vacuum is enumerated as an example of a method of forming the first sealing layer 34a. The first sealing layer 34a is approximately 200 nm to 400 nm in thickness. Next, the buffer layer 34b is formed that covers the first sealing layer 34a. In a method of forming the buffer layer 34b, for example, a solution including epoxy resin having transparency and epoxy resin solvent is used and is dispensed and dried using the printing method or the fixed-amount discharge method, thereby forming the buffer layer 34b made from the epoxy resin. The buffer layer 34b may be 1 µm to 5 µm in thickness and in this case is defined as 3 µm in thickness.

In addition, the formation of the buffer layer 34b is not limited to the use of an organic material such as epoxy resin. As described above, the silicon oxide film, as the buffer layer 34b, approximately 3 µm in thickness, may be formed by dispensing the dispensing-type inorganic material using the printing method and drying and firing the dispensed inorganic material.

Subsequently, the second sealing layer 34c is formed that covers the buffer layer 34b. The method of depositing silicon oxynitride (SiON) in a vacuum is enumerated as an example of a method of forming the second sealing layer 34c, which is the same as the method of forming the first sealing layer 34a. The second sealing layer 34c is approximately 200 nm to 400 nm in thickness. Then, proceeding to Step S2 takes place.

In the forming of the color filter in FIG. 6 (Step S2), as illustrated in FIG. 7B, first, photo-sensitive resin layer including a coloring material for green is dispensed using a spin-coating method and is dried, thereby forming the photo-sensitive resin layer. Thus, the coloration layer 36G for green (G) is formed by exposing and developing the photo-sensitive resin layer. The photo-sensitive resin layer covers the terminal portion 11t and then is formed. The patterning (exposure and development) is performed on the photo-sensitive resin layer to form the coloration layer 36G, and at the same time, the coloration layer 36G is patterned (exposed and developed) in such a manner that an opening is formed in a portion that overlaps the connection terminal 101 in the terminal portion 11t.

Subsequently, as illustrated in FIG. 7C, the coloration layer 36B for blue (B) is formed. The coloration layer 36B is formed in the same manner as the coloration layer 36G and is patterned (exposed and developed) in the opening is formed in a portion that overlaps the connection terminal 101 in the terminal portion 11t. Furthermore, in the cross-section of the base substrate 11 that includes the terminal portion 11t and one part of the display region E1, an end portion of the coloration layer 36B (the end portion facing toward the side of the display region E1), which is opposite to the side of the terminal portion 11t, is patterned (exposed and developed) in such a manner as to overlap the partition wall 28 that is positioned in the border portions of the display region E1 and the dummy region E2.

Then, as illustrated in FIG. 7D, the coloration layer 36R for red (R) is formed. The coloration layer 36R is formed in the same manner as the coloration 36B and has the opening in the portion that overlaps the connection terminal 101 in the terminal portion 11t, and an end portion of the coloration layer 36R (the end portion facing toward the side of the display region E1), which is opposite to the side of the terminal portion 11t, is patterned (exposed and developed) in such a manner as to overlap the partition wall 28 that is positioned in the border portions of the display region E1 and the dummy region E2. Thus, the opening portion 45, obtained as a result of patterning the coloration layers 36R, 36G, and 36B, is formed on portions of the first sealing layer 34a and the second sealing layer 34c that cover the connection terminal 101.

The opening portion 45, as illustrated in FIG. 9, is formed in such a manner that the multiple connection terminals 101 arranged on the terminal portion 11t are included within the opening portion 45. Then, proceeding to Step S3 takes place.

In etching the sealing layer (Step S3) in FIG. 6, as illustrated in FIG. 8A, the connection terminal 101 is exposed by etching the first sealing layer 34a and the second sealing layer 34c within the opening portion 45 with the coloration layers 36R, 36G, and 36B (the color filter 36) having the opening portion 45 serving as a mask. Dry etching in which fluorine-based process gas such as $CHF_3$ (methane trifluoride) or $CF_4$ (carbon tetrafluoride) is used is enumerated as a method in which the first sealing layer 34a and the second sealing layer 34c, made from the inorganic film such as silicon oxynitride (SiON), are selectively etched within the opening portion 45. The three coloration layers 36R, 36G, and 36B overlap. In the terminal portion 11t, but each of three coloration layers 36R, 36G, and 36B is a single layer in the display region E1. Therefore, it is preferable that the dry etching be performed with a metal mask 51 being arranged as a protective member in such a manner as to overlap the display region E1. Thus, the coloration layers 36R, 36G, and 36B on the display region E1 can be prevented from being damaged due to the dry etching.

In addition, if $CHF_3$ is used as fluorine-based process gas, because a selection ratio between the SiON film and the color filter 36 in the dry etching is favorable compared to $CH_4$, this can make the metal mask 51 unnecessary. A gas mixture of $C_4F_8$ (perfluorocyclobutane), $O_2$ (oxygen), CO (carbon monoxide), and Ar (argon) may be employed as the fluorine-based process gas that can ensure the selection ratio between the inorganic film and the organic layer (the color filter 36 according to the present embodiment) in the dry etching.

The method of etching the first sealing layer 34a and the second sealing layer 34c within the opening portion 45 is not limited to anisotropic etching such as the dry etching, and wet etching, which is isotropic etching, may be used. A solution including $NH_4F$ (ammonium fluoride) and HF (hydrogen fluoride) is enumerated as an etching solution. If such an etching solution is used, it is possible to ensure the selection ratio between the inorganic film and the organic layer in the etching. Then, proceeding to Step S4 takes place.

In the attaching of the substrates in FIG. 6 (Step S4), as illustrated in FIG. 8B, the transparent resin material having adhesive property is dispensed in such a manner as to cover the color filter 36. Then, the opposite substrate 41 is arranged at a given position with respect to the base substrate 11 on which the transparent resin material, and for example, the opposite substrate 41 is pressed toward the base substrate 11. Thus, the element substrate 10 and the opposite substrate 41 are attached to each other with the transparent resin layer 42 made from the transparent resin material in between. The transparent resin material is, for example, thermal curing epoxy resin. The transparent resin layer 42 is approximately 10 µm to 100 µm in thickness.

Thereafter, as illustrated in FIG. 2, the FPC 105 is built into the terminal portion 11t of the element substrate 10, thereby completing the organic EL device 100.

The method of manufacturing the organic EL device 100 is described above with one organic EL device 100 as a unit, but in reality, it is considered that multiple organic EL panels (in a state where the FPC 105 has yet to be built) are formed at the same time in the organic EL device 100. An example is described below in which a mother substrate is used.

Figure 10A:
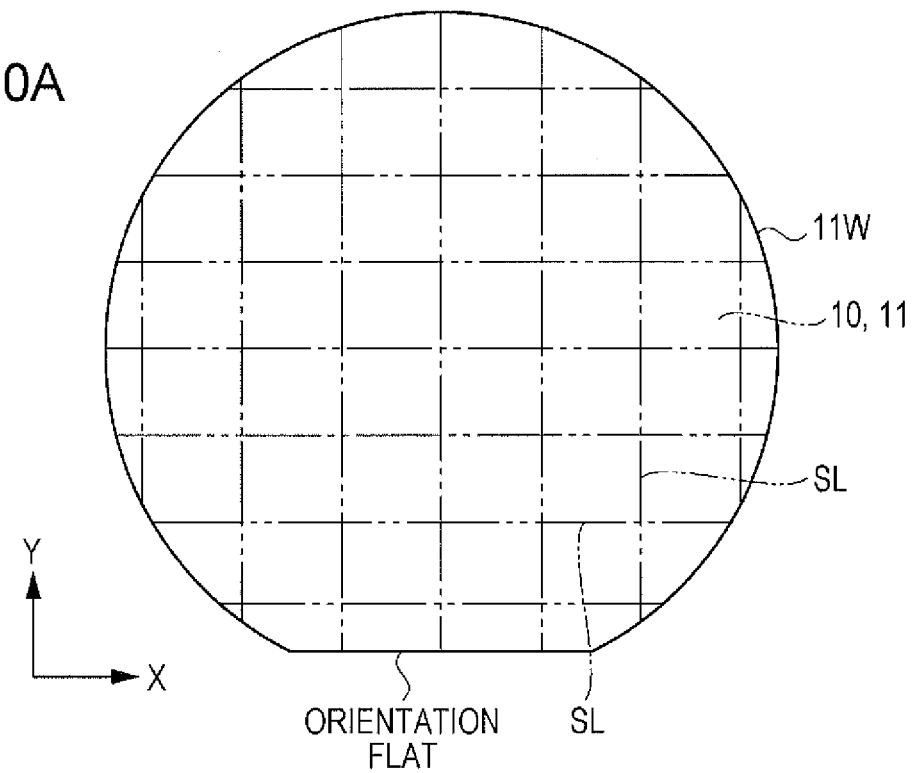
FIG. 10A is a schematic cross-sectional diagram illustrating a mother substrate to which multiple element substrates are surface-attached.
Figure 10B:
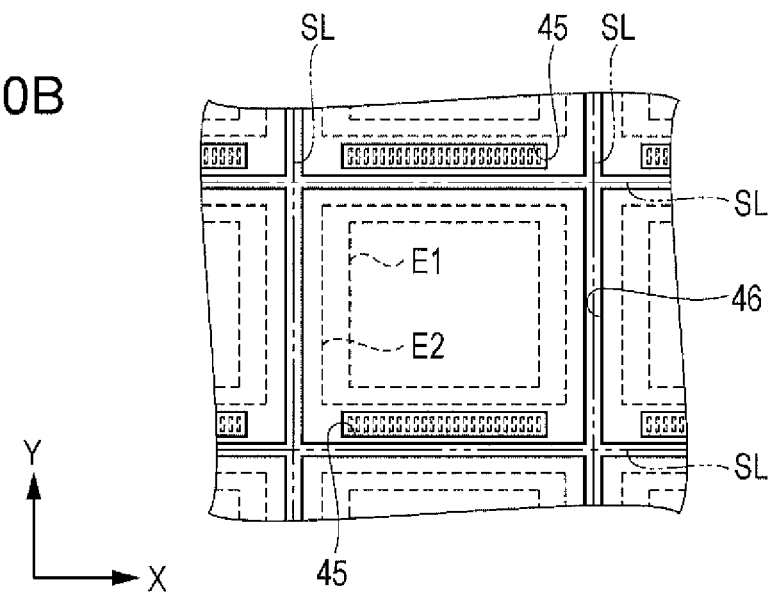
FIG. 10B is an enlarged schematic plan diagram illustrating the element substrate in a surface-attached state.
Figure 11A:
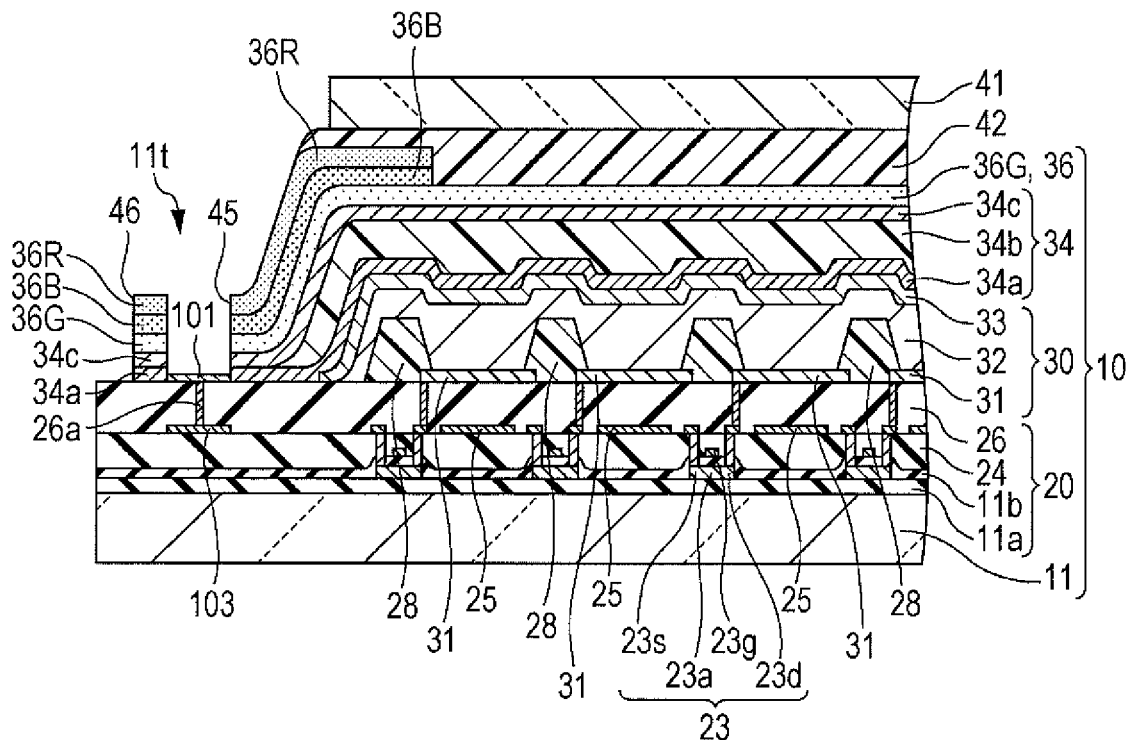
FIGS. 11A and 11B are schematic cross-sectional diagrams illustrating a construction of the terminal portion after the mother substrate is scribed.
Figure 11B:
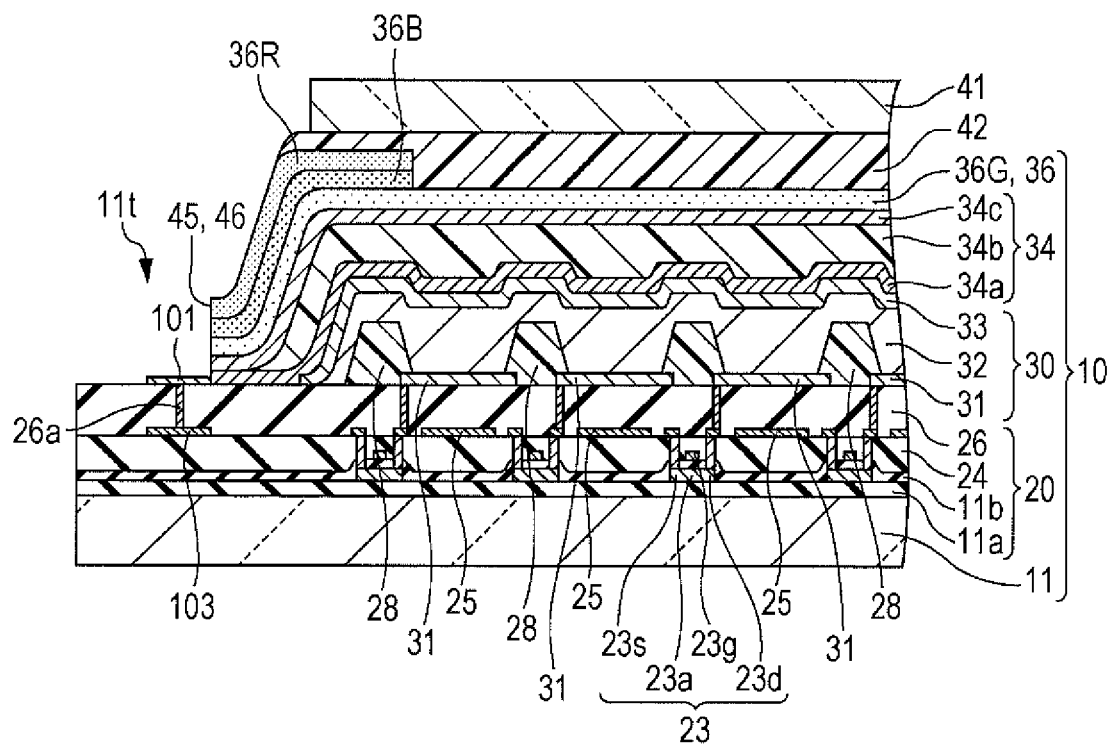

FIG. 10A is a schematic cross-sectional diagram illustrating the mother substrate to which the multiple element substrates are surface-attached. FIG. 10B is an enlarged schematic plan diagram illustrating the element substrate in a surface-attached state. FIGS. 11A and 11B are schematic cross-sectional diagrams illustrating a construction of the terminal portion after the mother substrate is scribed.

Since the organic EL device 100 according to the present embodiment is a top emission type, as described above, a transparent quartz substrate or an opaque substrate such as a silicon substrate can be used as the base substrate 11, the element substrate 10. As illustrated in FIG. 10A, a mother substrate 11W is, for example, the quartz substrate in the wafer form and has orientation flat in which one part of the outer boundary is cut off. In the mother substrate 11W, the multiple element substrates 10 are formed in a state where the multiple base substrates 11 are surface-attached in the X direction and in the Y direction, with the orientation flat as a reference. In the attaching of the substrates (Step S4), in a state where the multiple organic EL elements 30, the sealing layer 34, and the color filter 36 are completed, the opposite substrate 41 is attached with respect to each of the element substrates 10 by dispensing the transparent resin material. Thereafter, the mother substrate 11W is cut, along an imaginary scribe line SL between the element substrates 10, into the discrete organic EL panels. A brace-reinforced scribe method in which a cemented carbide tip or a diamond tip is used and a dicing method in which a diamond blade is used are enumerated as a cutting method.

When the first sealing layer 34a of and the second sealing layer 34c of the sealing layer 34 and the color filter 36 are formed over the entire surface of the mother substrate 11W, there is a concern that after cutting the mother substrate 11W, a crack or peeling will occur in portions of the first sealing layer 34a, the second sealing layer 34c, and the color filter 36 (the coloration layers 36R, 36G, and 36B), which are along the scribe line SL. In such a case, water or oxygen penetrates through the crack or the cleavage due to peeling into the functional layer 32 and thus there is a likelihood that a dark spot will occur.

Then, in the forming of the color filter (Step S2), as illustrated in FIG. 10B, the opening portion 45 is formed in portions of the color filter 36 (the coloration layers 36R, 36G, and 36B) which overlap the multiple connection terminal 101, and at the same time a slit portion 46 is formed by removing the portion that is along the scribe line SL. In the etching of the sealing layer (Step S3), the first sealing layer 34a and the second sealing layer 34c within the opening portion 45 and within the slit portion 46 are removed by the etching. If such a method is used, because even though the mother substrate 11W is scribed (cut or divided), as illustrated in FIG. 11A, the color filter 36 (the coloration layer 36R, 36G, and 36B) is patterned in such a manner that the color filter 36 does not sit on an edge of the element substrate 10 (the base substrate 11), that is, a cutting section, it is possible to decrease an occurrence of the crack or the peeling in the first sealing layer 34a and the second sealing layer 34c and the color filter 36 (the coloration layers 36R, 36G, and 36B).

Furthermore, the prevention of the crack and the peeling is not limited to the method of patterning the color filter 36, described above, and for example, the first sealing layer 34a and the second sealing layer 34c may be etched by combining the slit portion 46 and the opening portion 45 and patterning the color filter 36 in such a manner that the opening portion 45 is included in the slit portion 46. When this is done, as illustrated in FIG. 11B, in the terminal portion 11t, end portions (equivalent to the inside wall of the opening portion 45 (the slit portion 46)) of the first sealing layer 34a and the second sealing layer 34c and the color filter 36 may be kept away from the cutting section of the base substrate 11. In other words, if the connection terminal 101 can be exposed, the color filter 36 as the organic layer may not be patterned in such a manner as to surround the connection terminal 101.

In addition, a method of manufacturing the organic EL panel, in which the mother substrate is used, is not limited only to the side of the element substrate 10. That is, the method of manufacturing the organic EL panel can be applied to a method in which the mother substrate 11W to which the element substrate 10 is surface-attached and the mother substrate to which the opposite substrate 41 is surface-attached are combined and then are cut.

According to the first embodiment described above, the following effect can be obtained.

1. According to the organic EL device 100 and the method of manufacturing the organic EL device, the color filter 36 as the organic layer on the sealing layer 34 according to the invention is formed in such a manner as to cover the terminal portion 11t, and furthermore, the opening portion 45 piercing the portions of the coloration layers 36R, 36G, and 36E which overlap the multiple connection terminals 101. The dry etching is performed with the color filter 36 serving as the mask, and the multiple connection terminals 101 within the opening portion 45 are exposed by removing the first sealing layer 34a and the second sealing layer 34c within the opening portion 45. Therefore, a special process is made unnecessary in which a dedicated resist pattern is formed only for the purpose of exposing the multiple connection terminals 101 and the dedicated resist pattern is moved after the dry etching. To put it another way, the organic EL device 100 with high productivity and the method of manufacturing the organic EL device 100 can be provided.

Furthermore, since the multiple connection terminals 101 within the opening portion 45 can be certainly exposed by dry-etching the portions of the first sealing layer 34a and the second sealing layer 34c which overlap the multiple connection terminals 101, high reliability can be realized in the electrical connection between the multiple connection terminals 101 and the FPC 105.

2. In the etching of the sealing layer (Step S3), since the metal mask 51 as the protective member covering the display region E1 is used at the time of the dry etching, the color filter 36 in the display region E1 can be prevented from being damaged due to the dry etching.

3. When the organic EL panel making up the organic EL device 100 is formed using the mother substrate 11W, in the forming of the color filter (Step S2), not only the opening portion 45 that overlaps the multiple connection terminals 101, but also the slit portion 46 along the scribe line SL is formed. Therefore, since before cutting the mother substrate 11W, the portions of the first sealing layer 34a and the second sealing layer 34c, along the scribe line SL, are removed, it is possible to reduce the occurrence of the crack or the peeling in the first sealing layer 34a and the second sealing layer 34c toward the side of the edge of the element substrate 10 in cutting the mother substrate 11W.

Second Embodiment
Method of Manufacturing the Organic EL Device

Figure 12A:
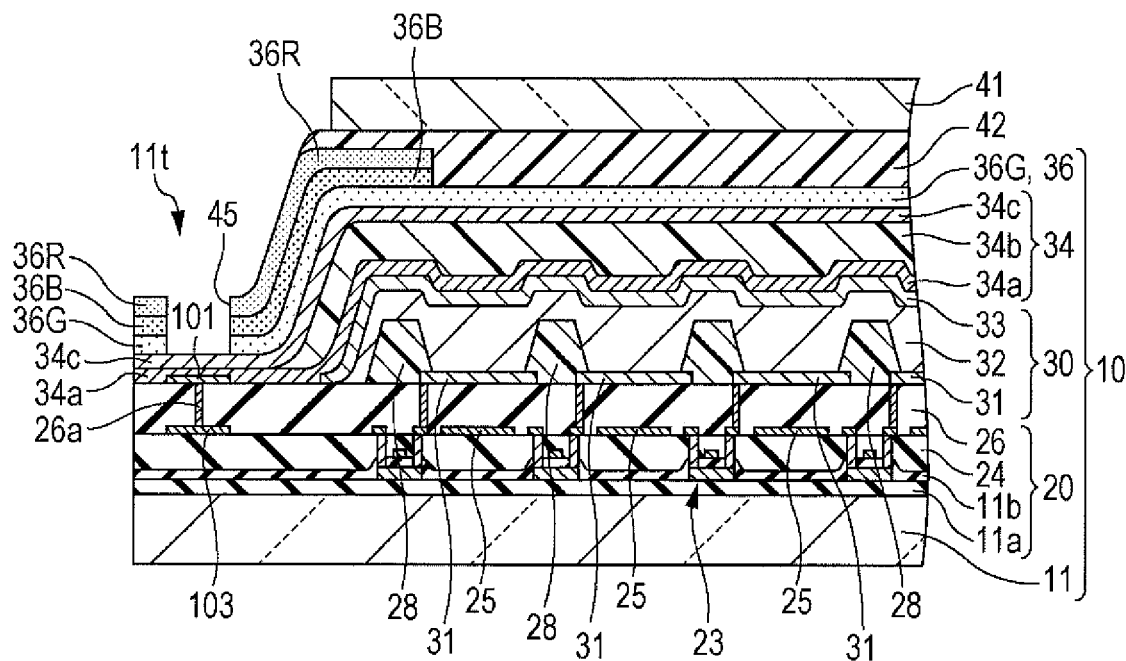
FIGS. 12A and 12B are schematic cross-sectional diagrams illustrating a method of manufacturing an organic EL device according to a second embodiment.
Figure 12B:
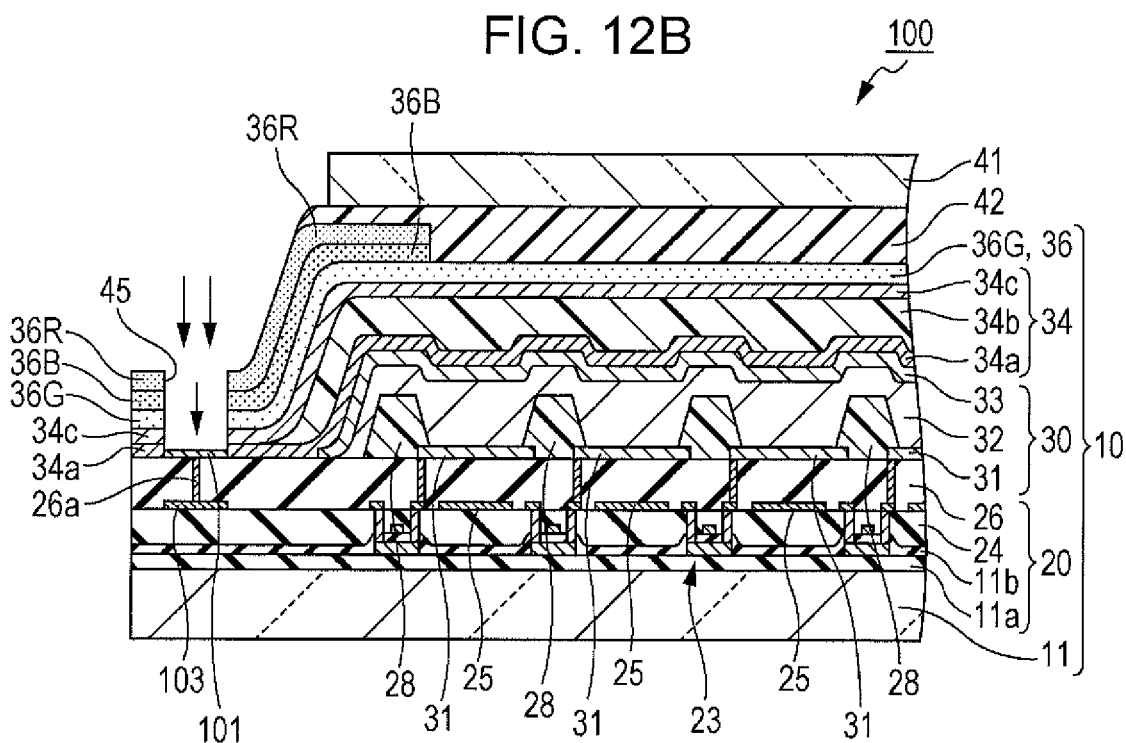

Next, a method of manufacturing an organic EL device 100 according to a second embodiment is described, referring to FIGS. 12A and 12B. FIGS. 12A and 12B are schematic cross-sectional diagrams illustrating the method of manufacturing the organic EL device according to the second embodiment. The method of manufacturing the organic EL device 100 according to the second embodiment has basically the same processes as the method of manufacturing the organic EL device 100 according to the first embodiment and is characterized by performing a sealing layer etching process after a substrate attachment process. For that reason, FIGS. 12A and 12B are cross-sectional diagrams equivalent to FIG. 5.

Specifically, as illustrated in FIG. 12A, an opposite substrate 41 is attached to an element substrate 10 on which a color filter 36 having an opening portion 45 is formed, with a transparent resin layer 42 in between. Then, as illustrated in FIG. 12B, multiple connection terminals 101 are exposed by etching a first sealing layer 34a and a second sealing layer 34c within the opening portion 45 with the color filter 36 serving as a mask. Etching may be performed using a dry etching method or a wet etching method.

In the method of manufacturing the organic EL device 100 according to the second embodiment, a metal mask 51 as a protective member is not necessary in the sealing layer etching process. Furthermore, even though the dry etching or the wet etching is performed, multiple organic EL elements 30 and the color filter 36 can be protected more certainly, compared to a case where the opposite substrate 41 is not present.

Third Embodiment

Organic EL Device and Method of Manufacturing the Organic EL Device

Figure 14:
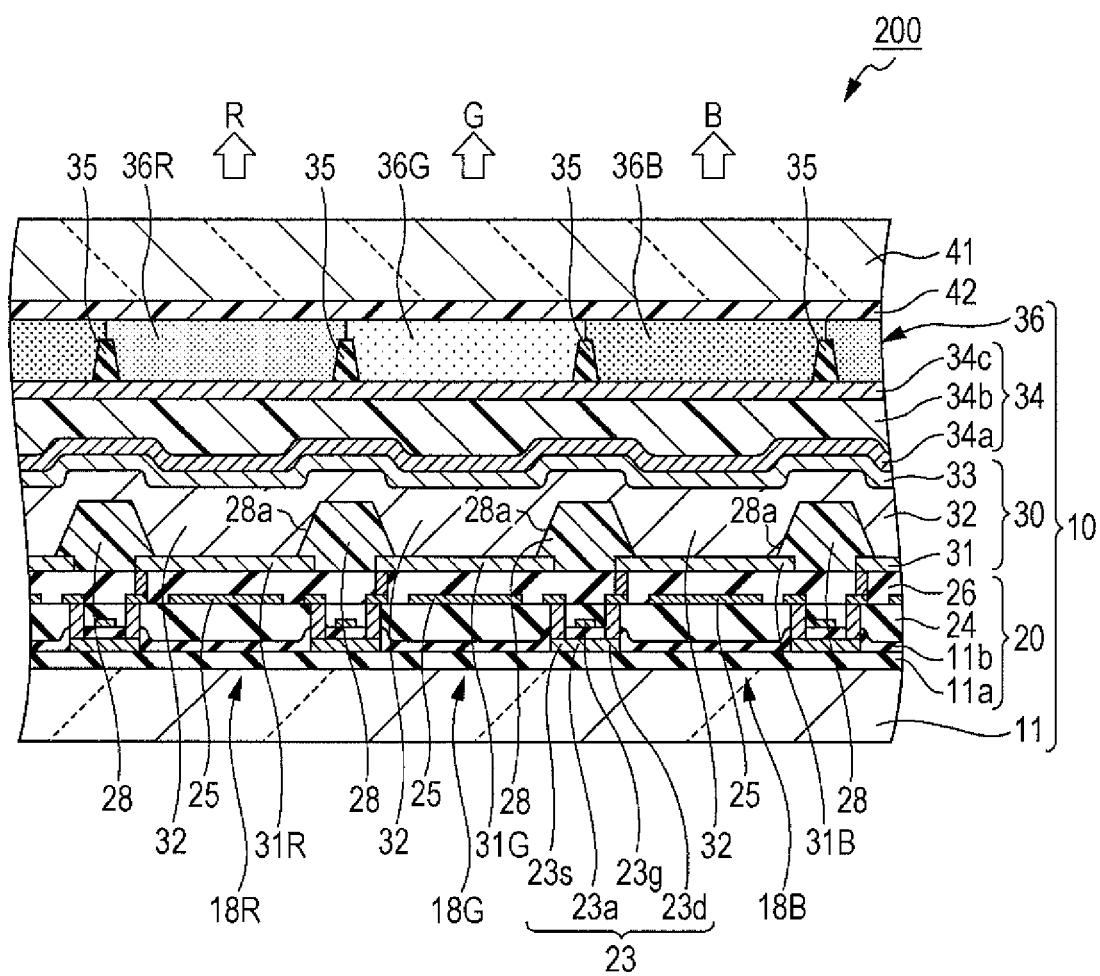
FIG. 14 is a schematic cross-sectional diagram illustrating the construction of the pixel of the organic EL device according to the third embodiment, taken along a line XIV-XIV in FIG. 13.
Figure 15:
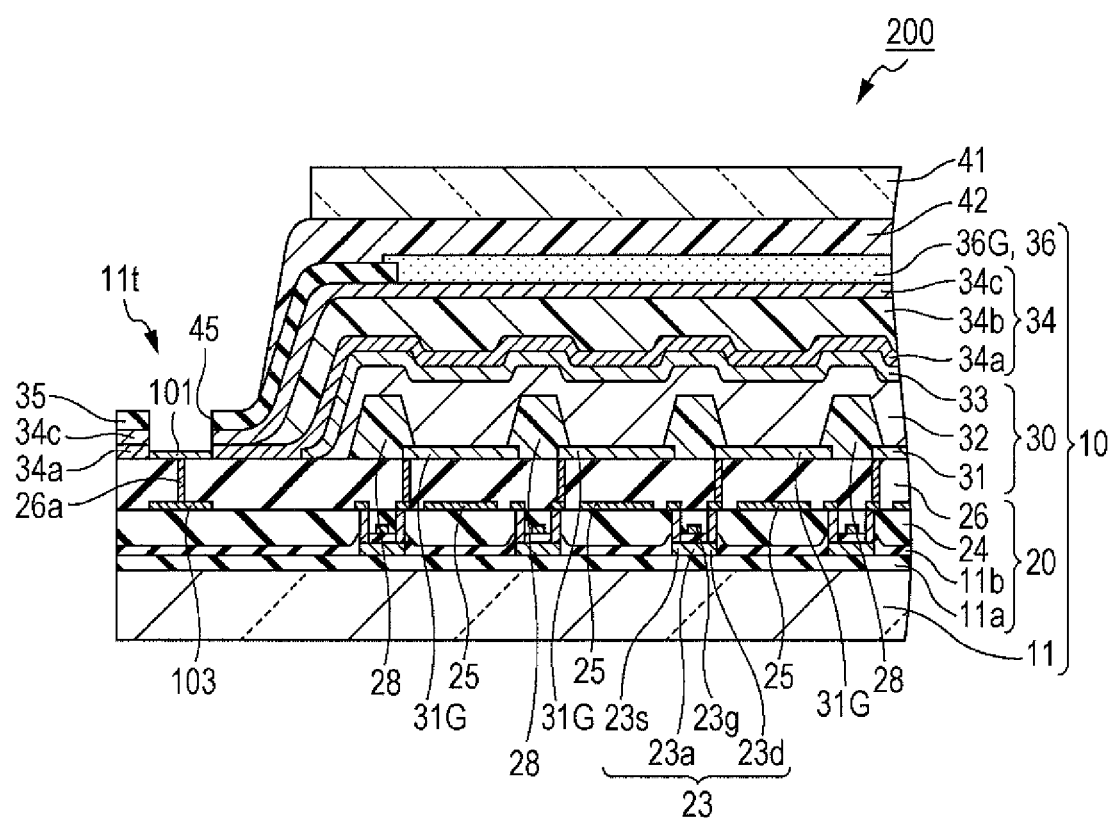
FIG. 15 is a schematic cross-sectional diagram illustrating a construction of the periphery of a terminal portion of the organic EL device according to the third embodiment.

Next, an organic EL device according to a third embodiment and a method of manufacturing the organic EL device are described referring FIGS. 13 to 15. FIG. 13 is a schematic cross-sectional diagram illustrating a configuration of a pixel of the organic EL device according to the third embodiment. FIG. 14 is a schematic cross-sectional diagram illustrating the construction of the pixel of the organic EL device according to the third embodiment, taken along a line XIV-XIV in FIG. 13. FIG. 15 is a schematic cross-sectional diagram illustrating a construction of the periphery of a terminal portion of the organic EL device according to the third embodiment. In addition, FIG. 15 is the schematic cross-sectional diagram equivalent to FIG. 5 according to the first embodiment.

The organic EL device according to the third embodiment results from differentiating a configuration of an organic layer formed on a sealing layer 34 with respect to the organic EL device 100 according to the first embodiment. Therefore, the same configurations as those according to the first embodiment are given like reference numerals, and the detailed descriptions thereof are omitted.

As illustrated in FIG. 13, in an organic EL device 200 according to the present embodiment, with regard to an arrangement of sub-pixels 18R, 18G, and 18B, the sub-pixels 18R, 18G, and 18B in each of which emission of color-different light can be obtained are arranged in this sequence in the X direction, and sub-pixels 18 in each of which emission of light with the same color can be obtained is arranged in the Y direction. The three sub-pixels 18R, 18G, and 18B arranged in the X direction are represented as one pixel 19.

A red (R) coloration layer 36R of a color filter 36 is formed in the form of a stripe in such a manner as to overlap pixel an electrode 31R that is arranged in the Y direction. A green (G) coloration layer 36G is formed in the form of a stripe in such a manner as to overlap pixel an electrode 31G that is arranged in the Y direction. A blue (B) coloration layer 36B is formed in the form of a stripe in such a manner as to overlap a pixel electrode 31B that is arranged in the Y direction. The coloration layers 36R, 36G, and 36B are formed adjacent to one another in the X direction. In addition, the color filter 36 according to the present embodiment extends in the Y direction between the color-different coloration layers and includes an insulation layer 35 in the form of a stripe which differentiates between the color-different coloration layers.

For details, as illustrated in FIG. 14, the insulation layer 35 is formed in the form of a stripe on the sealing layer 34 that covers the multiple organic EL elements 30. A cross-section of the insulation layer 35 is in the form of a trapezoid. The bottom of the insulation layer 35, which comes into contact with the sealing layer 34, is greater than the top portion. The insulation layer 35 is made from a photo-sensitive resin material that does not contain a coloring material. To put it another way, in a method of forming the insulation layer 35, a photo-sensitive resin layer is formed by dispensing the photo-sensitive resin material, which does not contain the coloring material, over an entire surface of a base substrate 11 using a spin-coating method, and the insulation layer 35 is formed by exposing and developing the photo-sensitive resin layer.

In forming the color filter, a photo-sensitive resin layer is formed by dispensing the photo-sensitive resin material containing the coloring material over an entire surface of the base substrate 11 in such a manner as to cover the insulation layer 35 using the spin-coating method, and each of the coloration layers 36R, 36G, and 36B is formed between the insulation layers 35. Therefore, a height of the insulation 35 on the sealing layer 34 is smaller (lower) than a film thickness of each of the coloration layers 36R, 36G, and 36B.

When forming the coloration layers 36R, 36G, and 36B by dispensing the photo-sensitive resin material containing the coloring material using the spin-coating method, in a case where the insulation layer 35 is not present, the photo-sensitive resin material is difficult to stay on a dispense surface and a utilization ratio of the photo-sensitive resin material is low. Consequently, the coloration layers 36R, 36G, and 36B are difficult to form in a predetermined film thickness. In contrast, the insulation layers 35 in the form of a stripe are provided, and the coloration layers 36R, 36G, and 36B are formed in such a manner that spaces between the insulation layers 35 are filled with the coloration layers 36R, 36G, and 36B. For this reason, the film thickness of each of the coloration layers 36R, 36G, and 36B is easy to increase. In other words, in the spin-coating method, the utilization ratio of the photo-sensitive resin material can be improved.

The cross-sectional shape of the insulation layer 35 is not limited to the trapezoid, but it is preferable that a length in the X direction of the bottom that comes into contact with the sealing layer 34 will be the same as a dimension between the pixel electrodes 31, approximately 0.5 μm to 1 μm. Furthermore, when the utilization ratio of the photo-sensitive resin material described above is considered, it is preferable that the height of the insulation layer 35 on the sealing layer 34 be smaller than the film thicknesses of the coloration layers 36R, 36G, and 36B and be equal to or more than half of the film thickness. According to the present embodiment, the height of the insulation layer 35 is defined as approximately 1 μm because the film thicknesses of the coloration layers 36R, 36G, and 36B are formed with the film thickness ranging from 1.5 μm to 2.0 μm.

If the insulation layer 35 is formed between the coloration layers of color-different sub-pixel 18 in this manner, it is possible to reduce color mixtures of or color balance changes in red light and green light, green light and blue light, and blue light and red light in terms of view angle properties because a ratio is decreased at which light emitted from the organic EL element 30 of the color-different sub-pixel 18 passes through the coloration layer that is different in color light from the coloration layer that the emitted light originally has to pass through.

Furthermore, as illustrated in FIG. 15, the insulation layer 35 is formed in such a manner as to cover a terminal portion 11t in a region outside of a display region E1. To put it another way, in the display region E1, the insulation layer 35 is formed in the form of a stripe that extends in the Y direction between the sub-pixels 18, but outside of the display region E1, the insulation layer 35 is formed in such a manner as to cover an entire non-display region including the terminal portion 11t.

Then, in the exposure and the development of the photosensitive resin layer that does not the coloring material, the insulation layer 35 is patterned in such a manner as to have an opening portion 45 in a portion that overlaps a connection terminal 101.

In a sealing layer etching process, the connection terminal 101 is exposed by etching a first sealing layer 34a and a second sealing layer 34c within the opening portion 45 with the insulation layer 35 serving as a mask. That is, according to the present embodiment, the insulation layer 35, which is provided extendedly over the non-display region outside of the display region E1 and is formed in the form of a stripe in the display region E1, is equivalent to the organic layer according to the invention.

According to the organic EL device 200 according to the third embodiment and the method of manufacturing the organic EL device 200, it is possible to provide or manufacture the organic EL device 200 in which the color mixture or the color balance change is decreased in terms of the view angle properties, when compared to the organic EL device 100 according to the first embodiment. In addition, it is difficult for the organic EL device 200 according to the third embodiment to be influenced by variation in alignment in the exposure and the development of the photo-sensitive resin layer because the opening portion 45 is formed in the process of forming the transparent insulation layer 35, when compared to a case where the opening portion 45 piercing through the coloration layers 36R, 36G, and 36B for three colors are formed according to the first embodiment. That is, the opening portion 45 can be formed that has high positional accuracy.

In addition, it is implied that according to the present embodiment, the insulating layer 35 can be patterned in such a manner that the insulation layer 35 does not sit on a cutting section of an element substrate 10 (a base substrate 11) or in such a manner that a slit portion 46 and the opening portion 45 are integrated into one piece.

Figure 16:
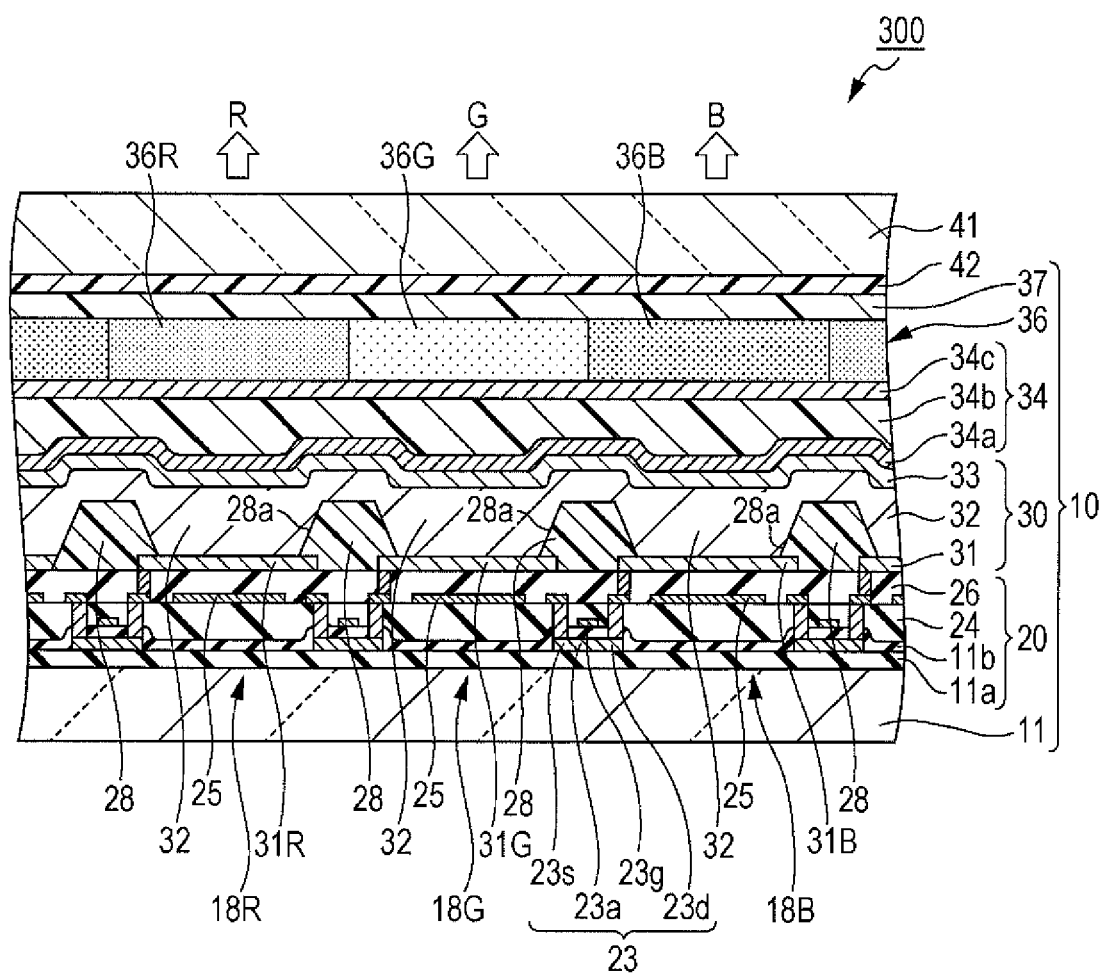
FIG. 16 is a schematic cross-sectional diagram illustrating a construction of a pixel of an organic EL device according to a fourth embodiment.
Figure 17:
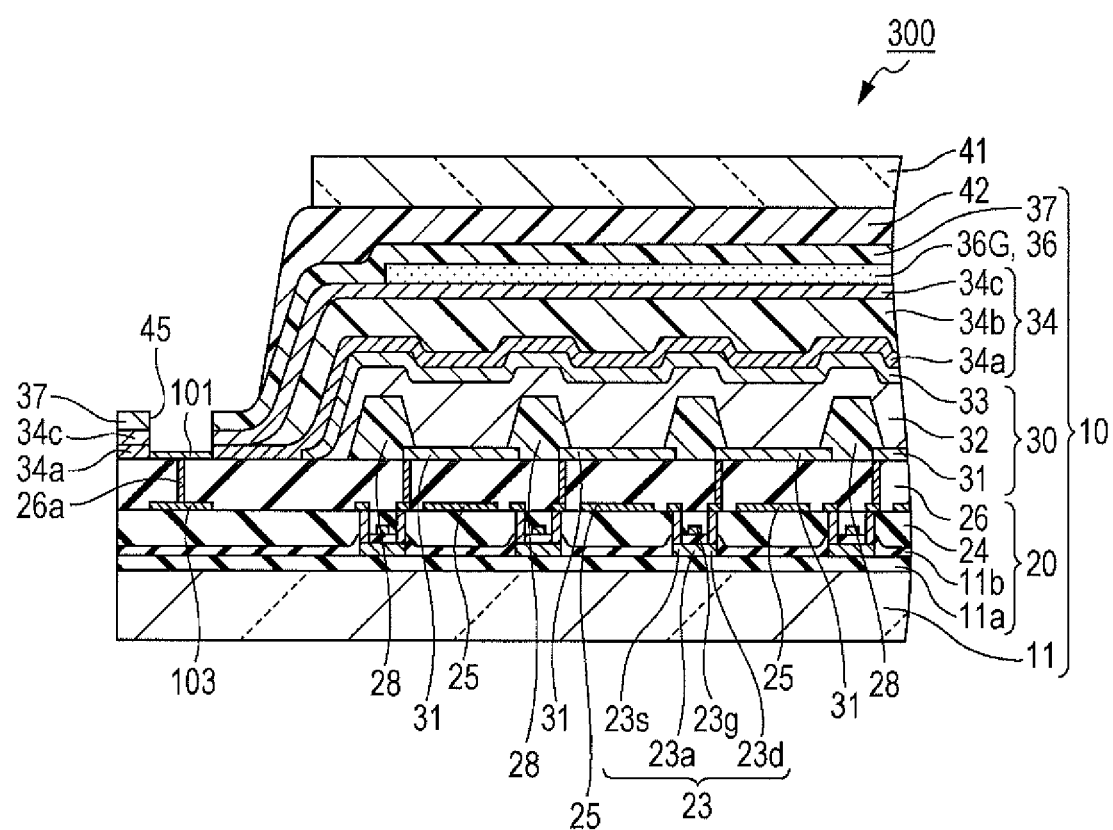
FIG. 17 is a schematic cross-sectional diagram illustrating a construction of the periphery of a terminal portion of the organic EL device according to the fourth embodiment.

Fourth Embodiment
Organic EL Device and Method of Manufacturing the Organic EL Device Next, an organic EL device according to a fourth embodiment and a method of manufacturing the organic EL device are described referring FIGS. 16 and 17. FIG. 16 is a schematic cross-sectional diagram illustrating a construction of a pixel of the organic EL device according to the fourth embodiment. FIG. 17 is a schematic cross-sectional diagram illustrating a construction of the periphery of a terminal portion of the organic EL device according to the fourth embodiment. FIG. 16 is the schematic cross-sectional diagram equivalent to FIG. 4 according to the first embodiment. FIG. 17 is the schematic cross-sectional diagram equivalent to FIG. 5 according to the first embodiment. The organic EL device according to the fourth embodiment results from differentiating a configuration of an element substrate 10 with respect to the organic EL device 100 according to the first embodiment. Therefore, the same configurations as those according to the first embodiment are given like reference numerals, and the detailed descriptions thereof are omitted.

As illustrated in FIG. 16, an organic EL device 300 has an element substrate 10 and an opposite substrate 41 that is arranged in such a manner as to face toward the element substrate 10 with a transparent resin layer 42 in between. The element substrate 10 is configured to include a pixel circuit 20, an organic EL element 30, a sealing layer 34, a color filter 36, and an overcoat layer 37, all of which are formed on a base substrate 11 in this sequence.

The overcoat layer 37 is formed for the purpose of alleviating surface irregularity of coloration layers 36R, 36G, and 36B formed on the sealing layer 34 and protecting the color filter 36. The overcoat layer 37 is hereinafter referred to as the OC layer 37. The OC layer 37 is formed in such a manner as to cover the color filter 36, for example, using an acrylic-based or a polyimide-based photo-sensitive resin material. The OC layer 37 is approximately 0.5 μm to 1 μm in thickness.

As illustrated in FIG. 17, the OC layer 37 is formed in such a manner as to cover a terminal portion 11t. To put it another way, the OC layer 37 is formed in such a manner as to cover a display region E1 and a dummy region E2 and a non-display region including a terminal portion 11t. Then, in exposure and development of a photo-sensitive resin layer made from the photo-sensitive resin material described above, the OC layer 37 is patterned in such a manner that the OC layer 37 has an opening portion 45 in the portion that overlaps a connection terminal 101.

In a sealing layer etching process, the connection terminal 101 is exposed by etching a first sealing layer 34a and a second sealing layer 34c within the opening portion 45 with the OC layer 37 serving as a mask. That is, according to the present embodiment, the OC layer 37 is equivalent to an organic layer according to the invention.

In the organic EL device 300 according to the fourth embodiment and the method of manufacturing the organic EL device, it is difficult for the organic EL device 300 according to the fourth embodiment to be influenced by variation in alignment in the exposure and the development of the photo-sensitive resin layer because the opening portion 45 is formed in the process of forming the transparent OC layer 37, when compared to a case where the opening portion 45 piercing through the coloration layers 36R, 36G, and 36B for three colors are formed according to the first embodiment. That is, the opening portion 45 can be formed that has high positional accuracy. In addition, even though the sealing layer etching process is performed after forming the OC layer 37, the color filter 36 can be prevented from being damaged due to dry etching without using a metal mask 51 as a protective member because the color filter 36 is covered with the OC layer 37.

Fifth Embodiment
Electronic Apparatus

Figure 18:
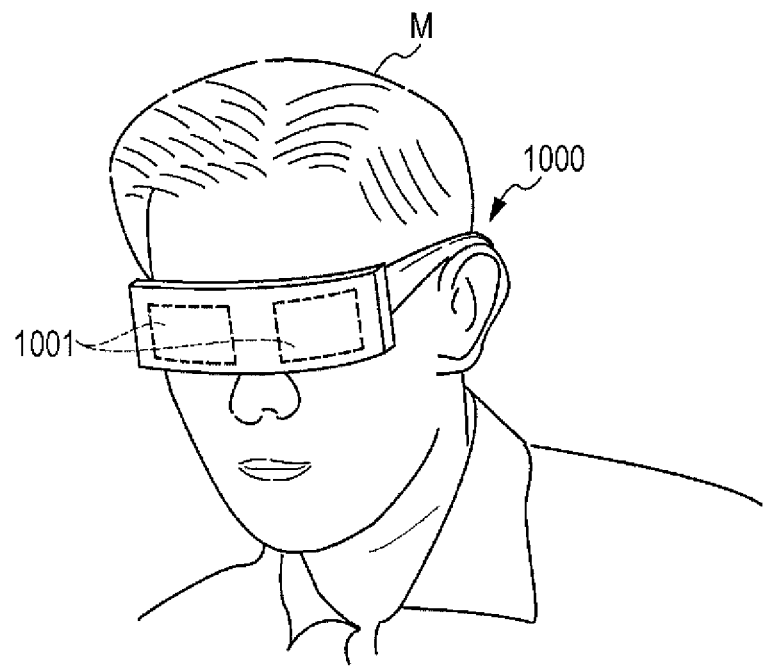
FIG. 18 is a schematic diagram illustrating a head-mountable display as an electronic apparatus.

Next, an electronic apparatus according to the present embodiment is described referring to FIG. 18. FIG. 18 is a schematic diagram illustrating a head-mountable display as the electronic apparatus.

As illustrated in FIG. 18, a head-mountable display (HMD) 1000 as the electronic apparatus according to the present embodiment has two display units 1001 provided to correspond to left and right eyes. A user M can view characters and images that are displayed on the display units 1001 by wearing the head-mountable display 1000 on the forehead like eye-glasses. For example, if parallactic images are displayed on the left and right display units 1001, the user can enjoy viewing three-dimensional images.

The display unit 1001 is equipped with the organic EL device 100 according to the first embodiment (or the organic EL device 200 according to the third embodiment, or the organic EL device 300 according to the fourth embodiment). Therefore, the small-sized, lightweight head-mountable display 1000 can be provided that is efficient in cost performance resulting from high productivity.

The head-mountable display 1000 is not limited to being equipped with the two display units 1001, but may be configured to include the one display unit 1001 corresponding to any one of left and right eyes without any limitation to the two display units 1001.

In addition, the electronic apparatus, equipped with the organic EL device 100, the organic EL device 200, or the organic EL device 300, is not limited to the head-mountable display 1000. As examples of this, the electronic apparatuses equipped with the display unit are enumerated such as a personal computer, a personal digital assistant, a navigator, a viewer, and a head up display.

The invention is not limited to the embodiments described above. Modifications thereto are possible within a scope not contrary to the gist or the technological idea of the invention, read from the aspects and the entire specification, and an organic EL device and a method of manufacturing the organic EL device and an electronic apparatus to which the organic EL device is applied are also included in a technological scope of the invention. In addition to the embodiment described above, various modification examples are considered. The modification examples are described below.

MODIFICATION EXAMPLE 1

The connection terminal 101 in the terminal portion 11t on the element substrate 10 is not limited to such a configuration. For example, the connection terminal 101, like the pixel electrode 31, is not limited to being formed on the second interlayer insulation film 26, and the wiring layer 103 on the first interlayer insulation film 24 may be defined as the connection terminal. Therefore, in the sealing layer etching process, the wiring layer 103 as the connection terminal may be exposed by etching the first sealing layer 34a and the second sealing layer 34c within the opening portion 45 and the second interlayer insulation film 26 with each of the color filter 36 formed as the organic layer, the insulation layer 35, and the OC layer 37 serving as the mask.

Furthermore, for example, the arrangement of the contact hole 26a electrically connecting the connection terminal 101 and the wiring layer 103 below the connection terminal 101 is not limited to being formed immediately under the connection terminal 101 and may be formed in a position that does not overlap the opening portion 45.

MODIFICATION EXAMPLE 2

Figure 19:
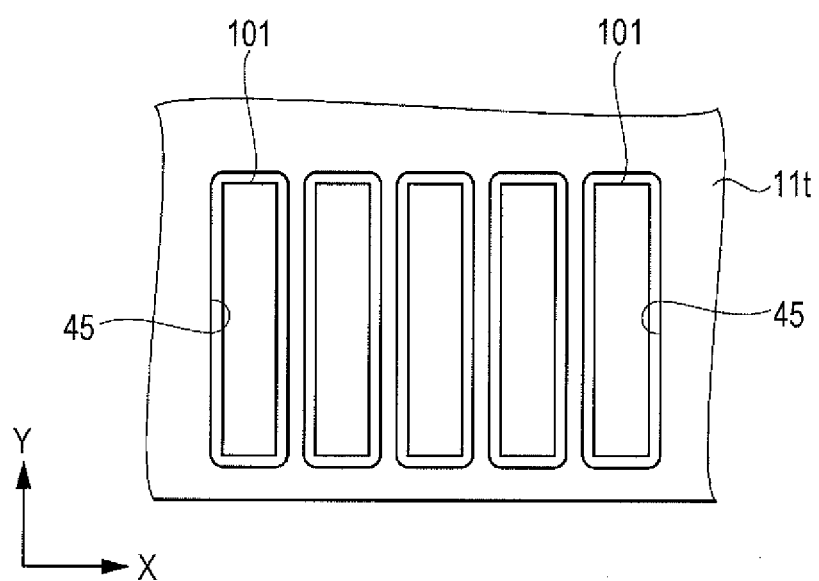
FIG. 19 is a schematic plan diagram illustrating an arrangement of an opening portion and a connection terminal according to a modification example.

According to each of the embodiments described above, the opening portion 45 is not limited to being formed in such a manner as to expose the multiple connection terminals 101. FIG. 19 is a schematic plan diagram illustrating the arrangement of the opening portion and the connection terminal according to the modification example. For example, as illustrated in FIG. 19, the opening portion 45 may be formed in such a manner that the connection terminals 101 are exposed one by one. If this is done, when the FPC 105 and the multiple connection terminals 101 are electrically connected, for example, using the anisotropic conductive film, insulation between the connection terminals 101 can be increased.

Furthermore, even though the opening portion 45 is not formed in such a manner as to expose all the multiple connection terminals 101, the multiple opening portions 45 may be formed in such a manner as to expose two or more connection terminals 101 as one unit among the multiple connection terminals 101.

Besides, if the electrical connection between the connection terminal 101 and the FPC 105 can be accomplished, the opening portion 45 may be formed in such a manner as to expose at least one part of the connection terminal 101.

MODIFICATION EXAMPLE 3

According to the first embodiment described above, the opening portion 45 is not limited to being formed in such a manner as to pierce through the deposited coloration layers 36R, 36G, and 36B for three colors. For example, the color filter 36 formed on the terminal portion 11t may result from depositing only the coloration layer for one color or the coloration layers for two colors. The number of deposited coloration layers may be determined by taking into consideration the selection ratio between the inorganic film and the organic layer, that is, the coloration layer in terms of the fluorine-based process gas used in the dry etching. If the number of deposited layers is insufficient with the coloration layers 36R, 36G, and 36B for three colors, a combination of the insulation layer 35 and the OC layer 37 may be possible.

MODIFICATION EXAMPLE 4

The connection terminal 101 that is exposed within the opening portion 45 is not limited to accomplishing the electrical connection between the connection terminal 101 and the FPC 105. For example, the invention can be applied also to the connection terminal for inspection that is provided to inspect a drive state or electric characteristics of each pixel circuit 20 through the inspection circuit 17 provided in the element substrate 10.

Furthermore, for example, if an alignment mark, used in determining a position of an output terminal of the FPC 105 and the connection terminal 101 of the element substrate 10, is provided in the terminal portion 11t on the element substrate 10, when the alignment mark is covered with the inorganic film or the organic layer (the coloration layer) that is not transparent, the mark alignment is difficult to identify in a positioning method in which a position is determined with image recognition for which an imaging element such as a charge-coupled device (CCD) is used. Accordingly, the opening portion for exposing the alignment mark may be formed in the organic layer (the coloration layer). In other words, it is preferable that the organic layer be patterned in such a manner as not to cover the alignment mark.

MODIFICATION EXAMPLE 5

The configuration of the sealing layer covering the terminal portion 11t is not limited to the first sealing layer 34a and the second sealing layer 34c. A configuration may be possible in which the terminal portion 11t is covered with the sealing layer 34 including the buffer layer 34b. Therefore, the first sealing layer 34a and the buffer layer 34b, and the second sealing layer 34c within the opening portion 45 are removed by the etching. The extension of the etching time is considered when compared to the case where the first sealing layer 34a and the second sealing layer 34c are etched, but the selection ratio can be ensured at the time of the etching. For example, the organic layer as the mask (the coloration layer of the color filter 36, the insulation layer 35, and the OC layer 37) may be selected or a type of fluorine-based process gas, used in the etching, or a type of fluorine-based solution may be selected.

MODIFICATION EXAMPLE 6

Figure 20A:
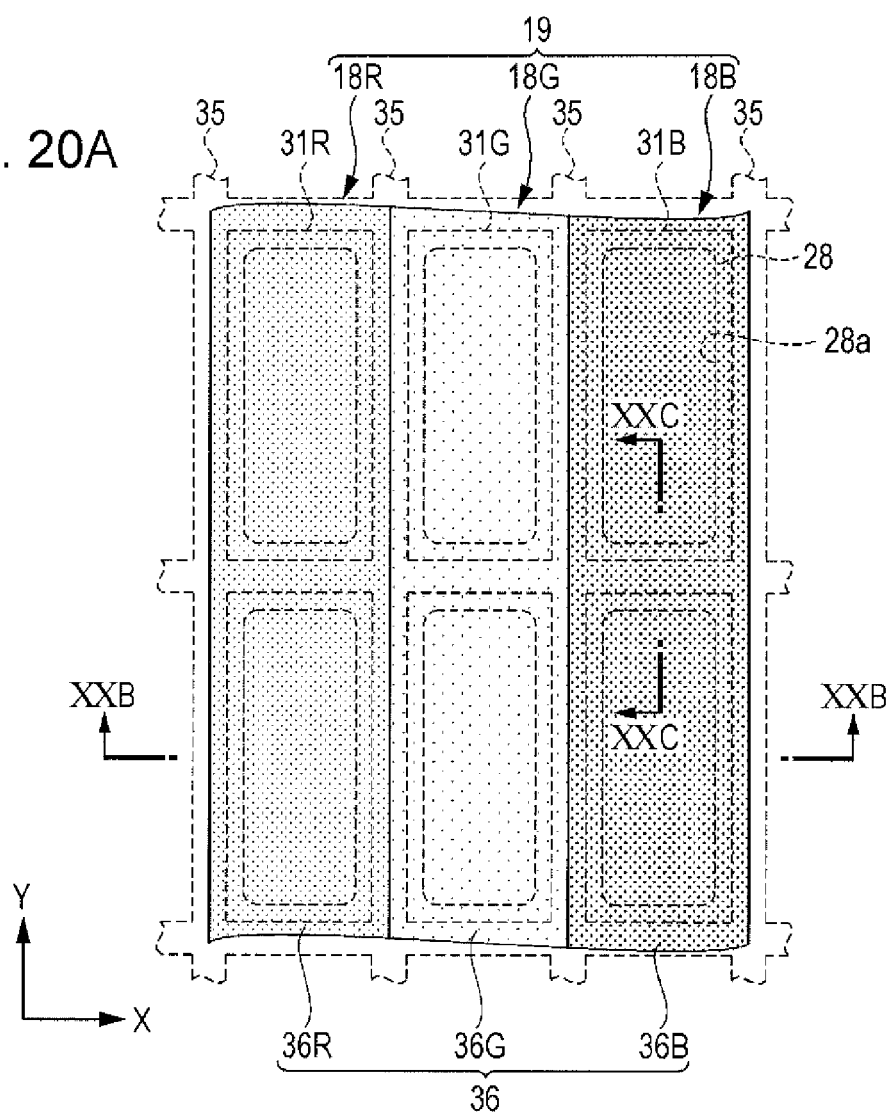
FIGS. 20A to 20C are shematic diagrams.
Figure 20B:
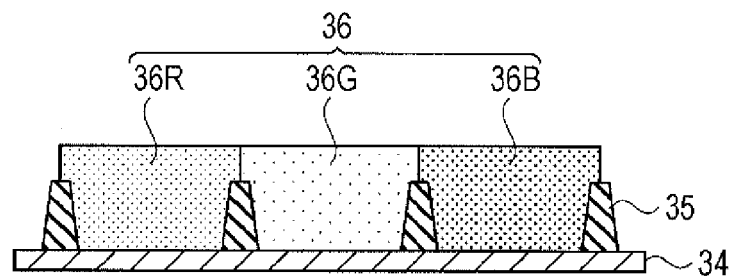
Figure 20C:
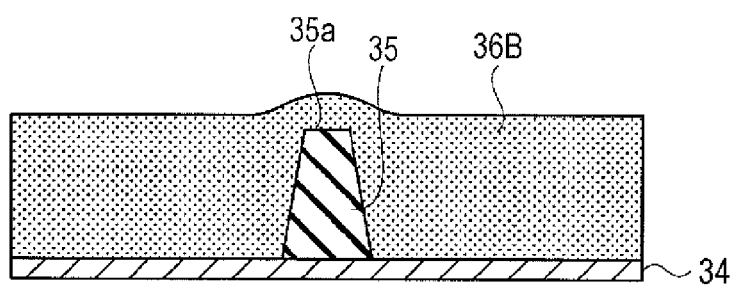

In the organic EL device 200 according to the third embodiment described above, the insulation layer 35 that is formed between the color-different coloration layers is not limited to extending in the Y direction within the display region E1 and being formed in the form of a stripe. FIGS. 20A to 20C are schematic diagrams illustrating the insulation layer according to the modification example. FIG. 20A is a schematic plan diagram. FIG. 20B is a schematic cross-sectional diagram taken along a line XXB-XXB in FIG. 20A. FIG. 20C is a schematic cross-sectional diagram taken along a line XXC-XXC in FIG. 20A. For example, as illustrated in FIGS. 20A and 20B, the insulation layer 35 may be formed such that insulation layer 35 extends along the long side and the short side of the pixel electrode 31 of the sub-pixel 18 in the X direction and in the Y direction in such a manner as to surround the opening portion 28a. That is, in the display region E1, the insulation layer 35 may be formed in the form of a lattice in such a manner that the sub-pixels 18R, 18G, and 18B results from the partitioning. As illustrated in FIG. 20C, a film covers the insulation layer 35 that is provided between the sub-pixels 18B representing the same color and the coloration layers 36B is formed by processing the film. The top portion 35a of the insulation layer 35 is also covered with the coloration layer 36B. The same is true for the other coloration layers 36R and 36G.

Since each of the coloration layers 36R, 36G, and 36B is formed by dispensing the photo-sensitive resin material including the coloring material using the spin-coating method, the insulation layer 35 according to the present modification example is provided in the form of a lattice. Thus, the coloration layers 36R, 36G, and 36B are formed in such a manner that spaces between the insulation layers 35 are filled with the coloration layers 36R, 36G, and 36B. For this reason, the film thickness of each of the coloration layers 36R, 36G, and 36B is easy to increase. In other words, in the spin-coating method, the utilization ratio of the photo-sensitive resin material can be more improved.

MODIFICATION EXAMPLE 7

In the organic EL devices 100, 200, and 300 according to the embodiments described above, light-emitting pixels provided on the display region E1 are not limited to the sub-pixels 18R, 18G, and 18B that correspond to emission of red (R), green (G), and blue (B) light, respectively. For example, in order to obtain a different color in addition to the three colors, a sub-pixel 18Y may be included in which emission of yellow (Y) light can be obtained. Accordingly, it is possible to further increase color reproductivity.

The present application claims priority to Japanese Patent Application No. 2012-237563 filed in the Japanese Patent Office on Oct. 29, 2012, the entire contents of which are incorporated herein by reference.

What is claimed is:

1. A method of manufacturing an organic EL device including a plurality of organic EL elements that are arranged on a substrate, the plurality of organic EL element including an organic light-emitting layer interposed between an anode and a cathode, and a connection terminal disposed on the substrate, the method comprising:
    forming a sealing layer by covering the plurality of organic EL elements and the connection terminal such that the plurality of organic EL elements lie between the substrate and the sealing layer;
    forming an organic layer that is formed above the sealing layer;
    patterning the organic layer in such a manner that an opening extending up to the sealing layer is formed in a portion of the organic layer, which overlaps the connection terminal; and
    etching the sealing layer in such a manner as to expose at least one part of the connection terminal with the pattern-formed organic layer serving as a mask.

2. The method of manufacturing an organic EL device according to claim 1,
    wherein the organic EL device includes a color filter including coloration layers representing at least red, green, and blue above the sealing layer, and
    wherein the organic layer is formed as at least the coloration layer representing at least one color.

3. The method of manufacturing an organic EL device according to claim 1,
    wherein the organic EL device includes a color filter including coloration layers representing at least red, green, and blue above the sealing layer, and
    wherein the organic layer is formed, as an insulation layer that differentiates between the coloration layers in terms of color, above the sealing layer.

4. The method of manufacturing an organic EL device according to claim 1,
    wherein the organic EL device includes,
    sub-pixels which includes one of the plurality of organic EL elements, and which are provided corresponding to at least red, green, and blue,
    a pixel including the color-different sub-pixels, and
    a color filter including coloration layers representing at least red, green, and blue on the sealing layer, and
    wherein the organic layer is formed, as an insulation layer that differentiates between the coloration layers in terms of color and differentiates between the sub-pixels, above the sealing layer.

5. The method of manufacturing an organic EL device according to claim 2,
    wherein in the etching of the sealing layer, the sealing layer is anisotropically etched in a state where a protective member is arranged in such a manner as to face toward the color filter.

6. The method of manufacturing an organic EL device according to claim 2, further comprising:
    arranging an opposite substrate with respect to the color filter with a transparent resin layer in between,
    wherein in the etching of the sealing layer, the sealing layer is etched with the opposite substrate in between.

7. The method of manufacturing an organic EL device according to claim 1,
    wherein the organic EL device includes a color filter including coloration layers representing at least red, green, and blue above the sealing layer, and
    wherein the organic layer is an overcoat layer that is formed above the color filter.

8. The method of manufacturing an organic EL device according to claim 1,
    wherein in the patterning of the organic layer, the opening portion is formed in such a manner as to be opened over a plurality of the connection terminals.

9. An electronic apparatus comprising:
    the organic EL device formed using the method of manufacturing an organic EL device according to claim 1.

10. An electronic apparatus comprising:
    the organic EL device formed using the method of manufacturing an organic EL device according to claim 2.

11. An electronic apparatus comprising:
the organic EL device formed using the method of manufacturing an organic EL device according to claim 3.

12. An electronic apparatus comprising:
the organic EL device formed using the method of manufacturing an organic EL device according to claim 4.

13. An electronic apparatus comprising:
the organic EL device formed using the method of manufacturing an organic EL device according to claim 5.

* * * * *